United States Patent [19]
Bitting

[11] Patent Number: 6,107,856
[45] Date of Patent: Aug. 22, 2000

[54] DUAL OUTPUT COMPARATOR FOR OPERATING OVER A WIDE COMMON MODE RANGE

[75] Inventor: Ricky F. Bitting, Fort Collins, Colo.

[73] Assignee: LSI Logic Corporation, Milpitas, Calif.

[21] Appl. No.: 09/001,062

[22] Filed: Dec. 30, 1997

[51] Int. Cl.[7] .............................. H03L 5/00; H03F 3/45
[52] U.S. Cl. ........................ 327/307; 327/65; 327/563
[58] Field of Search .................... 327/333, 307, 327/563, 108, 52, 65, 58, 178; 326/30, 83, 86; 330/255

[56] References Cited

U.S. PATENT DOCUMENTS

| | | | |
|---|---|---|---|
| 5,210,527 | 5/1993 | Smith et al. .............................. | 327/76 |
| 5,311,083 | 5/1994 | Wanlass .................................... | 326/68 |
| 5,317,537 | 5/1994 | Shinagawa et al. ................ | 365/189.04 |
| 5,497,127 | 3/1996 | Sauer ....................................... | 331/17 |
| 5,519,728 | 5/1996 | Kuo ......................................... | 326/86 |
| 5,570,042 | 10/1996 | Ma ........................................... | 326/63 |
| 5,589,785 | 12/1996 | Garavan ................................... | 327/63 |
| 5,600,275 | 2/1997 | Garavan .................................. | 327/307 |
| 5,621,340 | 4/1997 | Lee et al. ................................. | 327/65 |
| 5,682,102 | 10/1997 | Min ......................................... | 326/64 |
| 5,734,294 | 3/1998 | Bezzam et al. ......................... | 327/552 |
| 5,793,239 | 8/1998 | Kovacs et al. .......................... | 327/262 |
| 5,798,660 | 8/1998 | Cheng ....................................... | 327/65 |
| 5,821,799 | 10/1998 | Saripella .................................. | 326/62 |
| 5,847,598 | 12/1998 | Sone ....................................... | 327/563 |
| 5,955,918 | 5/1993 | Uno ........................................ | 327/307 |

*Primary Examiner*—Timothy P. Callahan
*Assistant Examiner*—Terry L. England

[57] ABSTRACT

Data and strobe comparators are provided wherein each comparator includes a wide-swing bias circuit, an input stage, a current bias circuit, a load circuit, an output buffer and a clamp circuit. The wide-swing bias circuit, input stage, current bias circuit, load circuit, and a clamp circuit comprise a well-controlled preamplifier circuit. The input stage includes low-threshold transistors that receive differential inputs. The transistors form a single stage input. The low-threshold transistors turn on at several hundred millivolts, and from an operational perspective, almost immediately. The well-controlled aspect of preamplifier is achieved since all the transistors are made from the same semiconductor manufacturing process and have their physical dimensions precisely matched. An output buffer is connected to the preamplifier. Such a buffer is used for both data and strobe reception. The buffer includes a differential-to-single-ended converter that includes low-threshold transistors. The buffer can be disabled when clocked data is not being received.

14 Claims, 29 Drawing Sheets

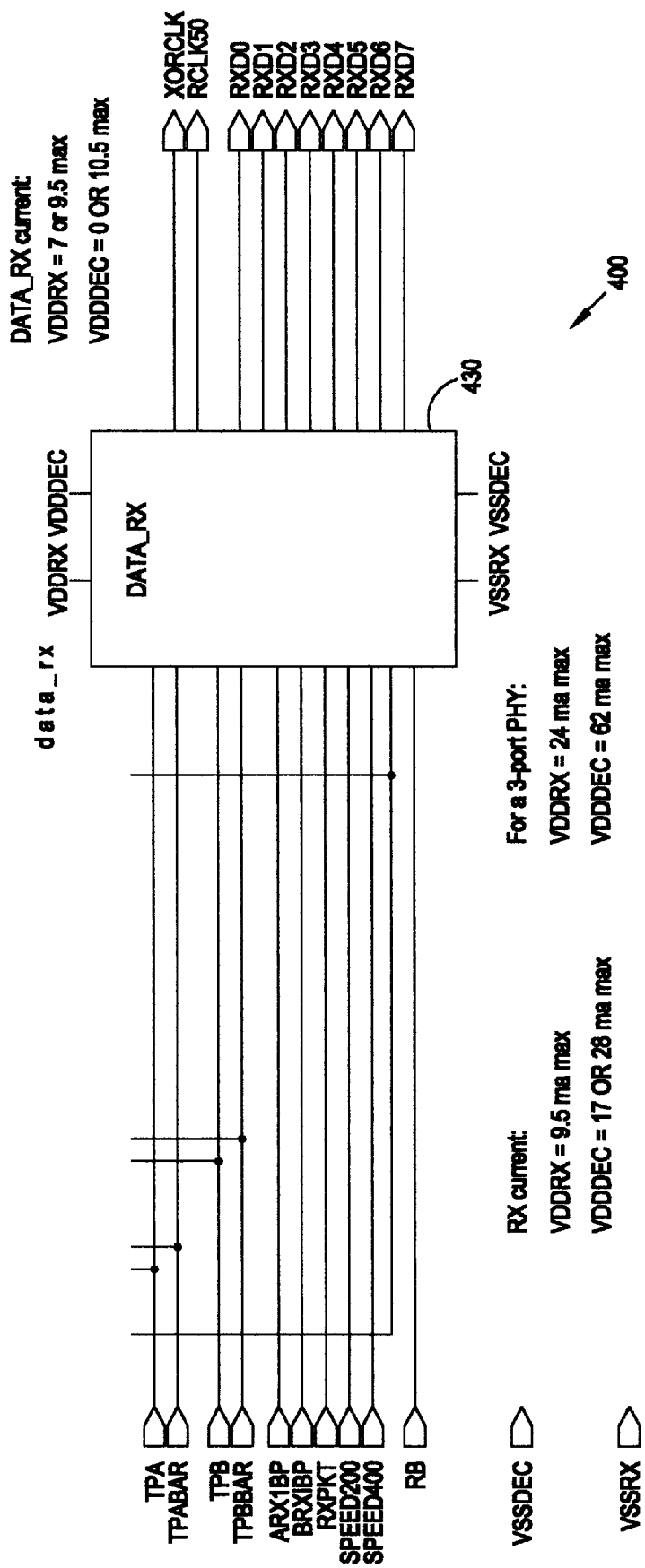
FIGURE 4"

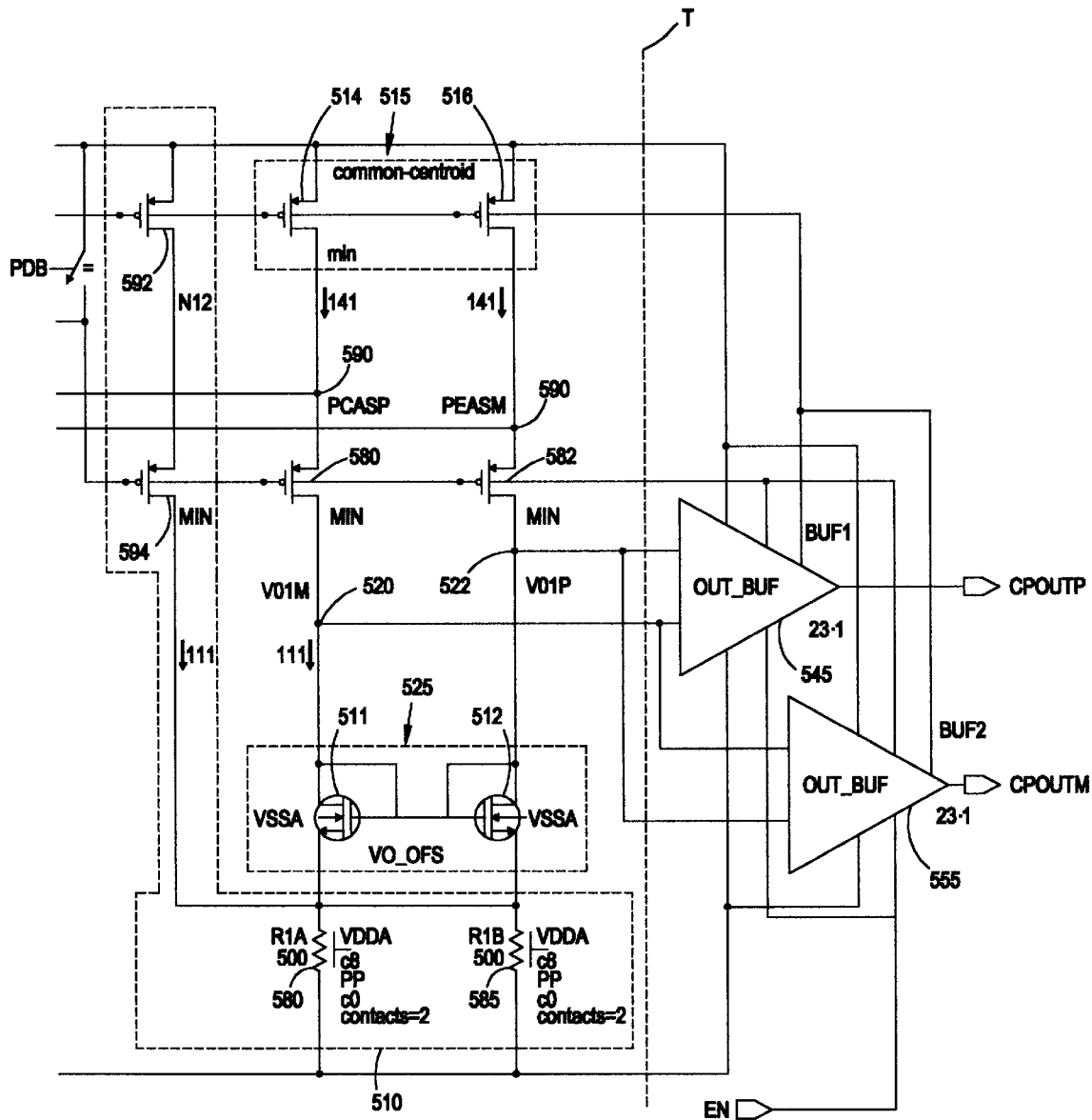
FIGURE 5"

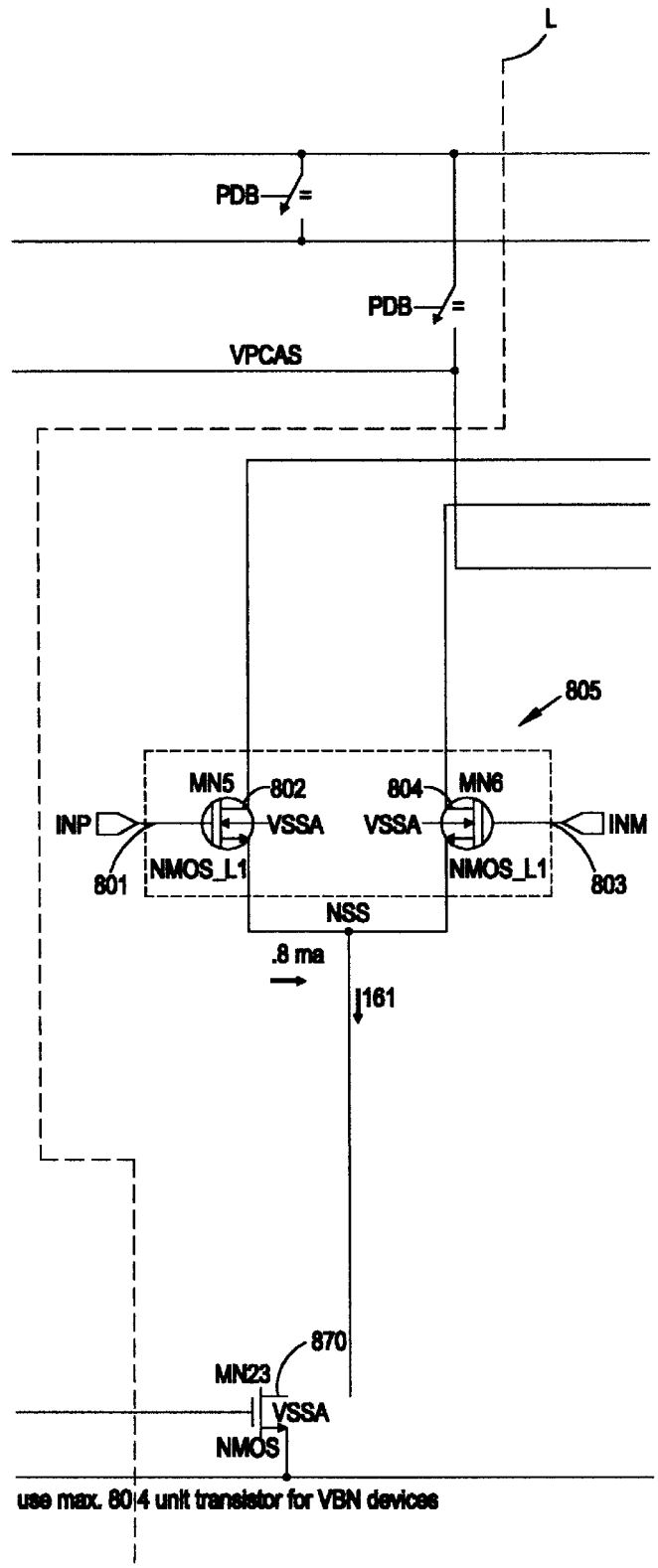
FIGURE 8"

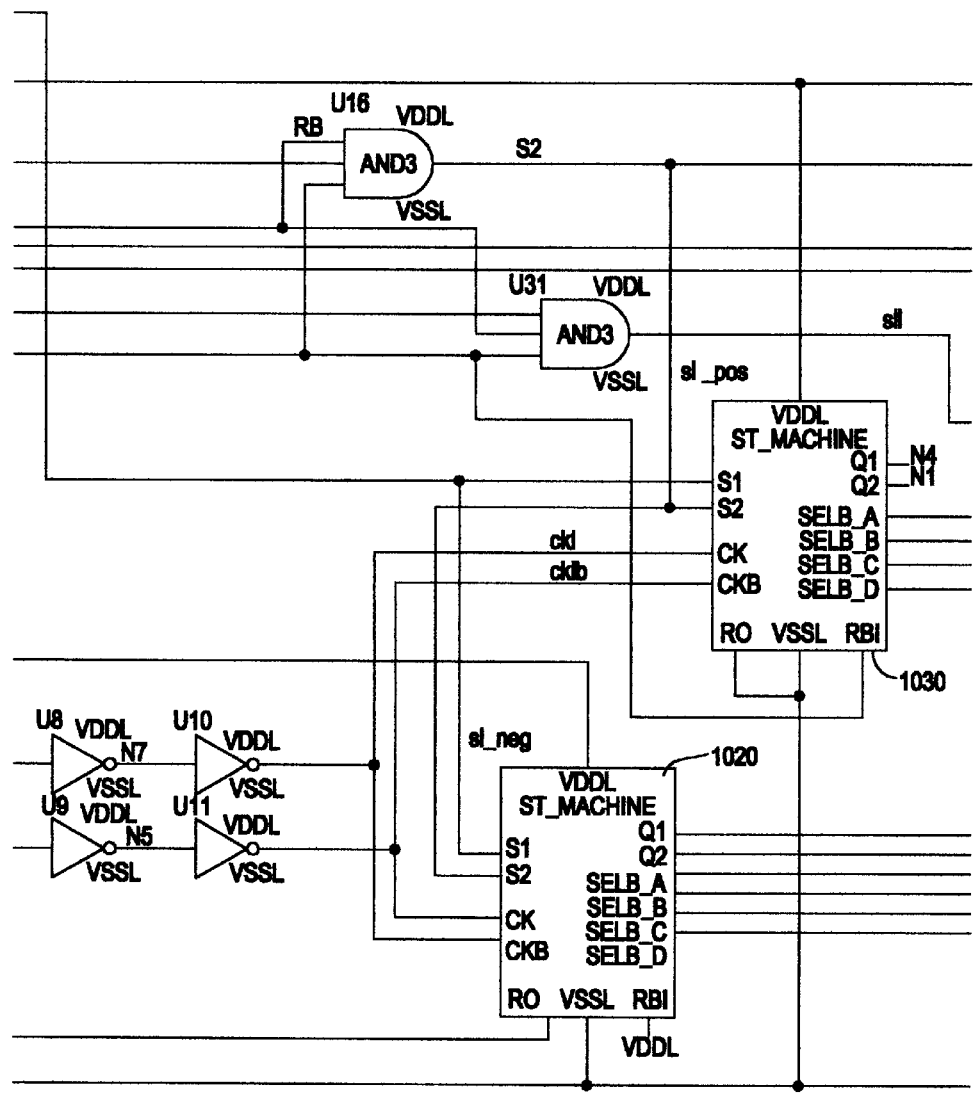
FIGURE 10"

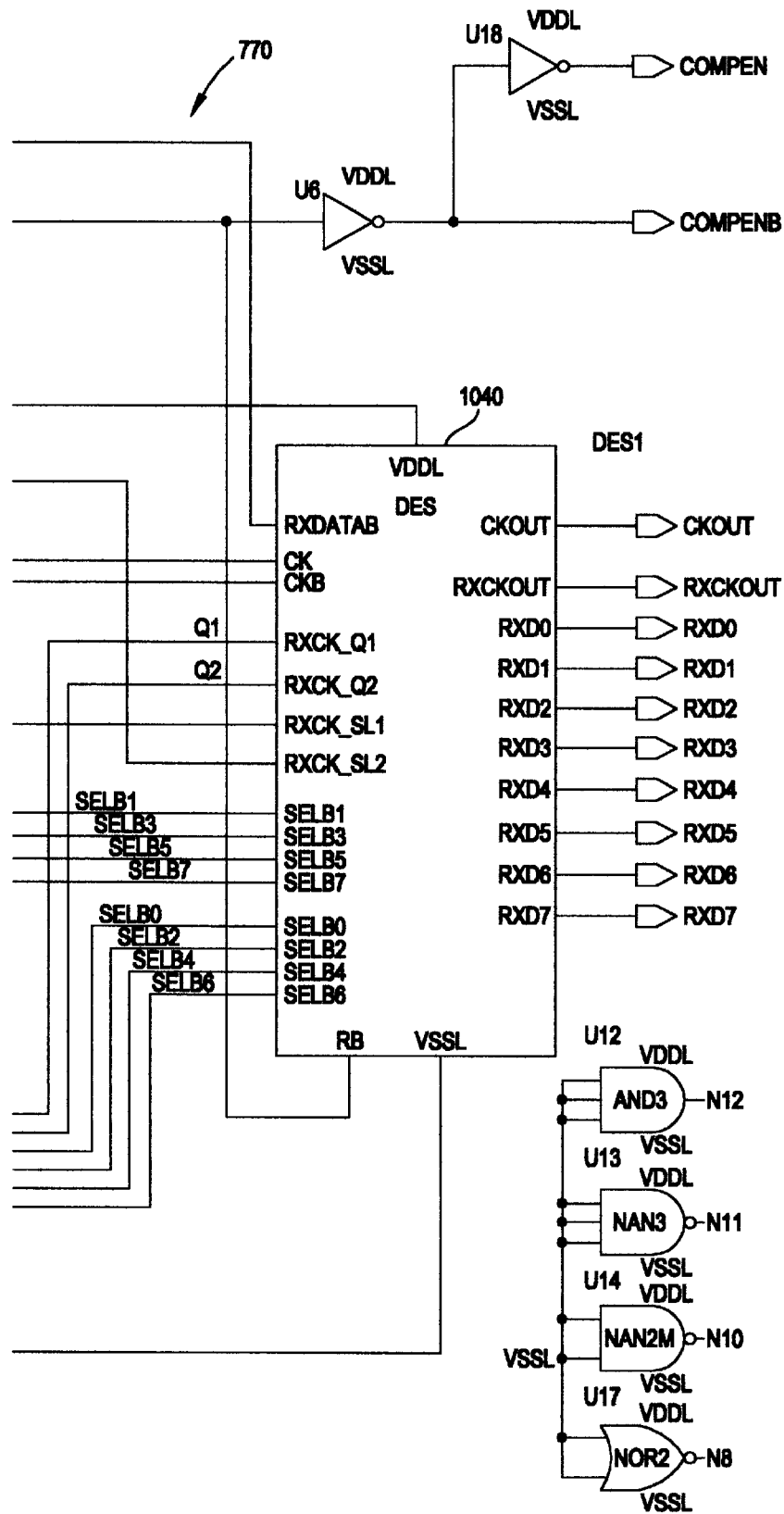
FIGURE 10''''

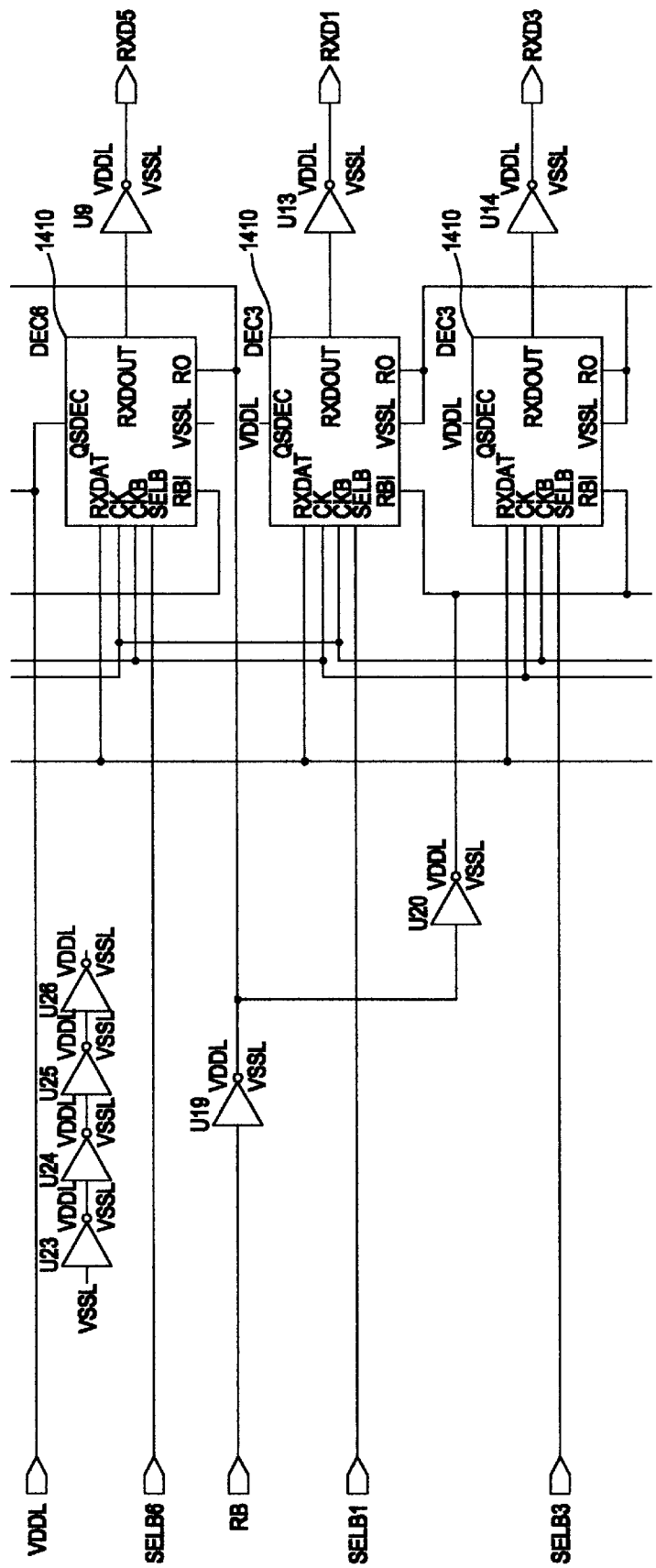
FIGURE 14"

6,107,856

DUAL OUTPUT COMPARATOR FOR OPERATING OVER A WIDE COMMON MODE RANGE

FIELD OF THE INVENTION

The present invention relates to an electronic bus and more particularly to a high-speed, digital serial bus interface.

BACKGROUND OF THE INVENTION

The computer and consumer electronic industries are presently developing and implementing a scaleable, flexible, easy to use, low-cost serial digital interface or bus. This bus is known as 1394, which is derived from the IEEE 1394-1995 standard for High Performance Serial Bus, and is hereby incorporated herein by reference. The IEEE 1394 standard defines a backplane physical layer and the serial bus. The bus supports data rates of 100, 200 and 400 Mbits/sec, with 800 and 1600 Mbits/sec planned.

The 1394 bus is digital, which eliminates the need to convert digital data into analog. This provides for better signal integrity. The 1394 bus is a physically small cable (about ⅓ the size of a SCSI cable) that does not require a user to perform a complicated setup. The cable is also hot-pluggable and can support multiple speeds. The 1394 supports daisy chaining and peer-to-peer connections of nodes. Each node typically has three bus connectors or ports, but the 1394 standard provides from one to twenty-seven ports per node.

FIG. 1 shows a cut-away of the 1394 bus cable. Cable 100 includes twisted pairs 110, 120, and power wires 130, 140. Twisted pair 110 provides bi-directional non-return-to-zero data, and is conventionally known as $T_pA$. Twisted pair 120, conventionally known as $T_pB$, provides a strobe signal that accompanies the transmitted data. The strobe signal changes state whenever two consecutive NRZ data bits are the same. This ensures that a transition occurs on either the data or the strobe signal for each bit period. As a result, a clock that transitions each bit period can be derived by combining the data and strobe signal with an exclusive-or function. FIGS. 2A–C illustrate the data and strobe signal relationship.

A 1394 protocol includes three layers: physical, link and transaction. Of particular concern to the present invention, the physical layer includes the bus connectors or ports that can number from one to twenty-seven. The physical layer provides arbitration to ensure that only one node at a time is sending data. It also electrically translates signals between the link layer and the 1394 bus.

One problem confronted with data rates of 400 Mbits/sec or greater is jitter. Ideally, the data and the strobe signal transitions are one bit period apart. However, jitter skews these transitions. This jitter then causes erroneous derivation of the clock from the data and the strobe signal. Considering at a 400 Mbits/sec data rate having a 2.5 ns bit period, the clock is a pulse of a relatively short duration (about 1.25 nanoseconds). This clock is used to clock other circuitry of the physical layer, particularly flip-flops. Erroneous derivation will obviously propagate throughout the physical layer to interrupt proper data reception.

Another problem associated with the ports of a node (collectively "transceiver port") is that, in order to get acceptable signal integrity, the twisted pairs should have an approximate nominal 110 ohms impedance. It is therefore desirable to terminate the twisted pairs as close as possible to 110 ohms. Any capacitance across the twisted pair that is not a pure termination causes signal reflections. The 1394 specification requires a differential capacitance of 4 pf on those ports. However, it is practically difficult to meet the requirement because not only are there receiver ports connected to the 1394 bus, but there is also package capacitance and board capacitance.

A further problem with 1394 is that it is a direct coupled system. In other words, there are no coupling capacitors or transformers between port transceivers and the twisted pairs. In fact, the common mode DC level is actually used as a signaling means to signal a port about what speed that they are capable of operating. As a result, the common mode level may have shifted. This is a design problem because potentially the data and strobe port can have a different DC common model level. Furthermore, a biased voltage which is generated at one of the ports and transferred to the other port, and is usually accompanied by a variation. Also, the power cable pair can have up to a 0.5 volt drop in the ground line between the two ports.

All this dictates that a data receiver needs to operate over a wide common mode range.

Unfortunately, that range is wider than the range provided from a one device-type input stage in the receiver input of the transceiver (assuming a 3.3V power supply). For example, a NMOS input stage can normally operate from close to the positive voltage supply to about 1.5 volts above the negative voltage supply. That 1.5 volts is directly determined by the threshold voltage of the receiver transistors.

A need exists for a 1394 bus receiver that can properly operate at high data rates. In particular, a 1394 bus receiver is needed that is immune to jitter and can operate over a wide common mode voltage range so that data can be properly received. The present invention meets this need.

SUMMARY OF THE INVENTION

Data and strobe comparators are provided according to one aspect of the present invention. Each comparator includes a wide-swing bias circuit, an input stage, a current bias circuit, a load circuit, an output buffer and a clamp circuit. Wide-swing bias circuit, input stage, current bias circuit, load circuit, and a clamp circuit comprise a well-controlled preamplifier circuit.

Input stage includes low-threshold transistors that receive differential inputs. The transistors form a single stage input. The low-threshold transistors turn on at several hundred millivolts, and from an operational perspective, almost immediately. The well-controlled aspect of the amplifier is achieved since all the transistors are made from the same semiconductor manufacturing process and have their physical dimensions precisely matched.

An output buffer is connected to the preamplifier. Such a buffer is used for both data and strobe reception. The buffer includes a differential-to-single-ended converter that includes low-threshold transistors. The buffer can be disabled when clocked data is not being received.

Numerous other advantages and features of the present invention will become readily apparent from the following detailed description of the invention and the embodiments thereof, from the claims and from the accompanying drawings in which details of the invention are fully and completely disclosed as a part of this specification.

DETAILED DESCRIPTION OF THE PREFERRED EMBODIMENT

Figure 1:
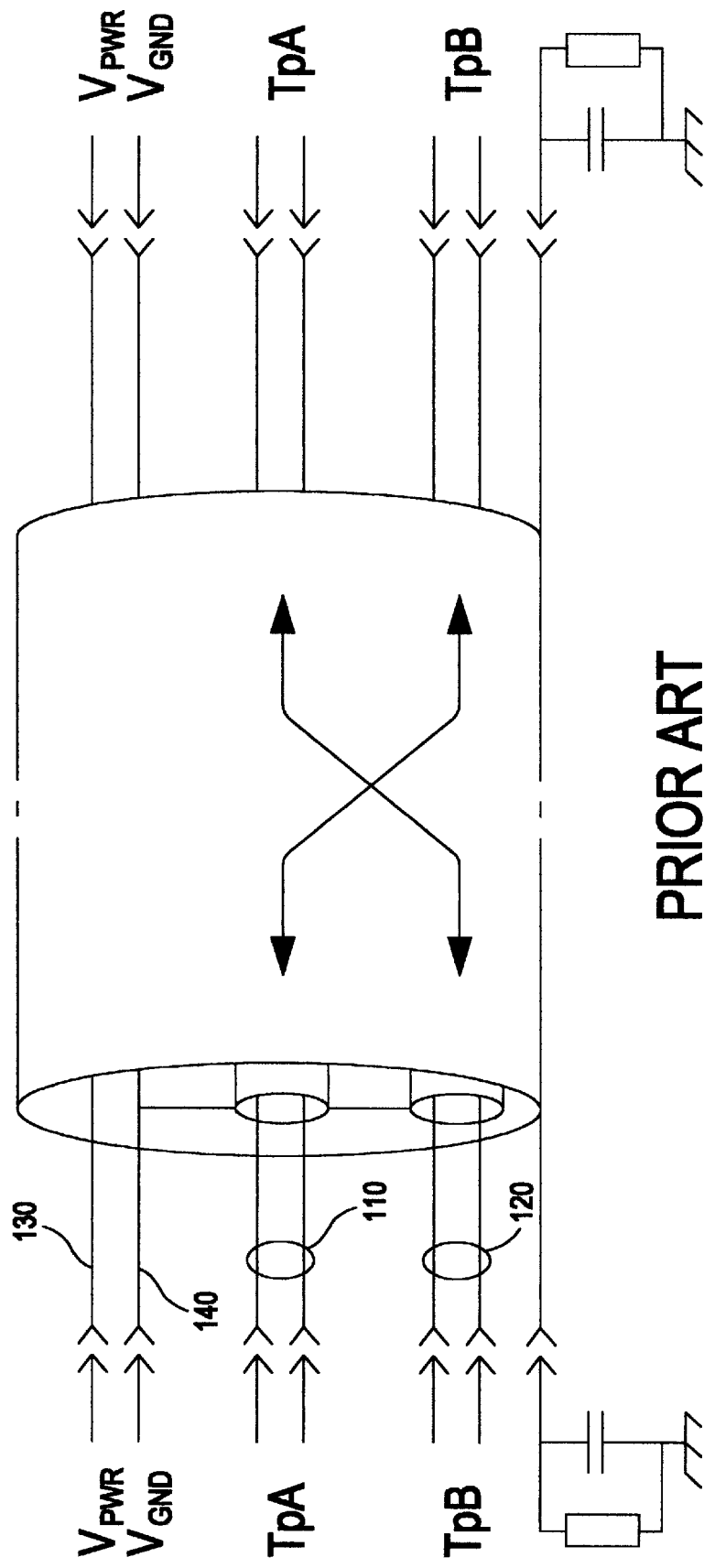
FIG. 1 is a cut-away of a 1394 bus cable.
Figure 2:
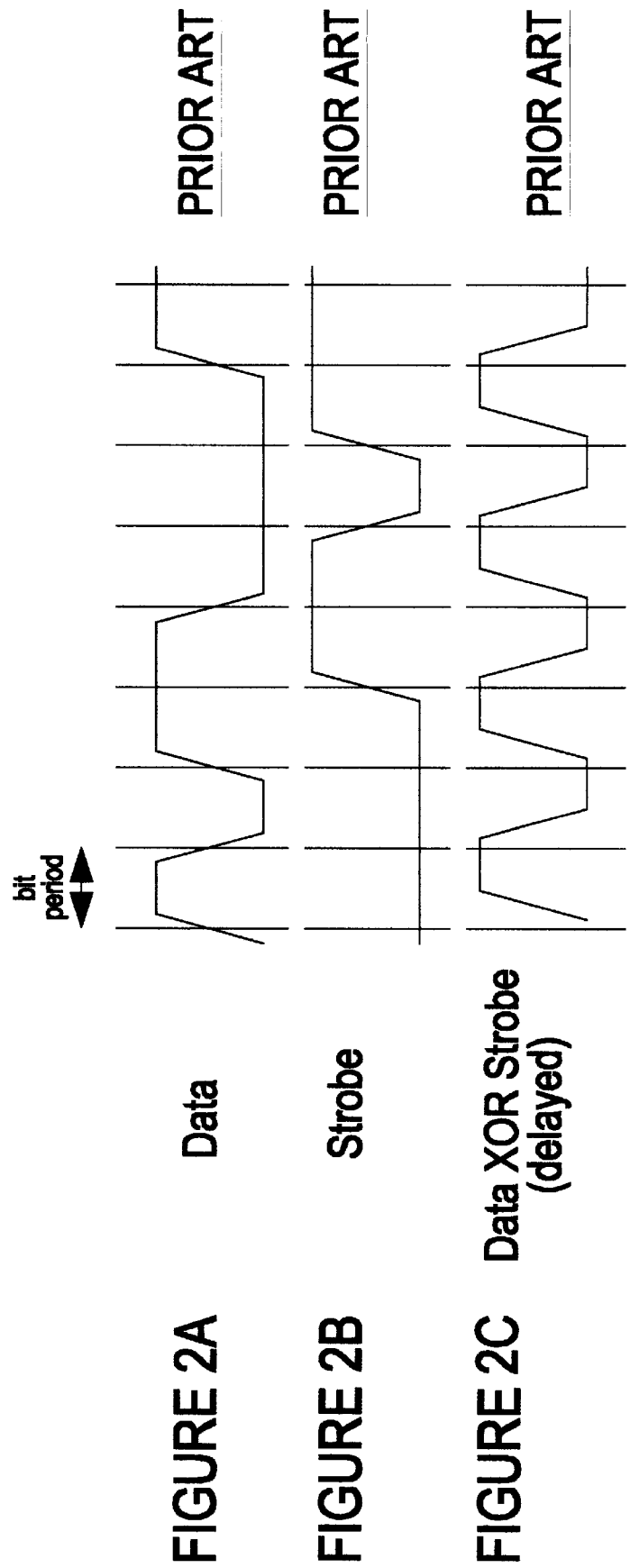
FIGS. 2A–C are timing diagrams showing the relationship between the data, strobe signal and clock signal (data XOR strobe)

While this invention is susceptible of embodiment in many different forms, there is shown in the drawings and will be described herein in detail a specific embodiment thereof with the understanding that the present disclosure is to be considered as an exemplification of the principles of the invention and is not to be limited to the specific embodiment described.

Figure 3:
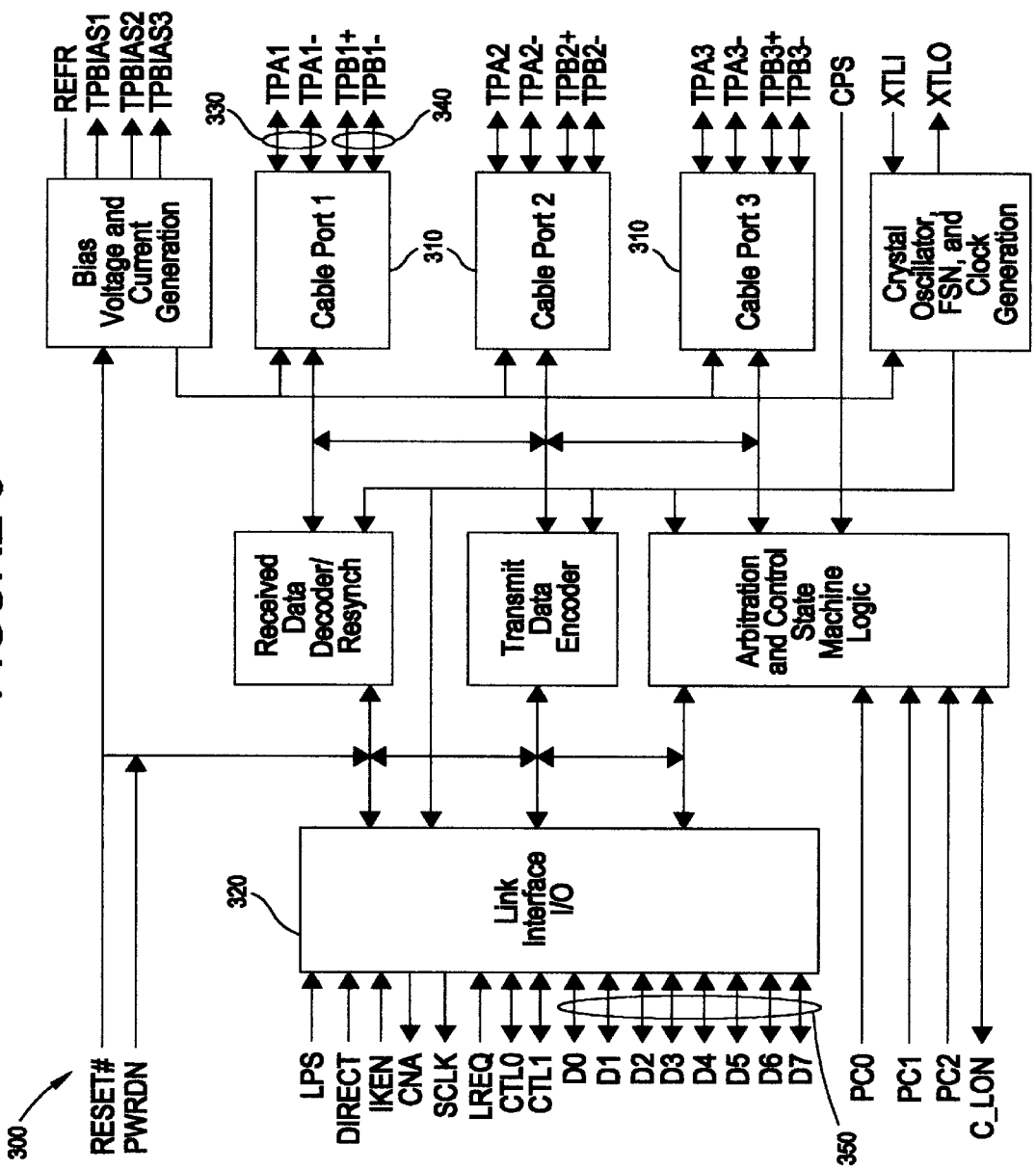
FIG. 3 is a block diagram of a physical layer.

FIG. 3 is a block diagram illustration of an implementation of a physical layer 300. This implementation is part of an integrated circuit SYM13FW403 that is available from Symbios, Inc. of Fort Collins, Colo. One function of physical layer 300 is to translate electrical signals between the 1394 bus connected to ports 310 and a link layer (not shown) that is coupled to a link interface I/O 320. Each port 310 is connected to respective twisted pairs. To illustrate, one of the ports 310 is shown connected to twisted pairs 330, 340.

Twisted pair 330 provides data from another node connected to a 1394 bus. This data is translated by physical layer 300 into electrical signals that are compatible with the link layer via leads 350. Conversely, the link layer provides data on leads 350 that are electrically translated by physical layer 300 and transmitted over twisted pair 340, for example. The data from the link layer can be transmitted on a twisted pair of another one of the ports 300.

Figure 4:
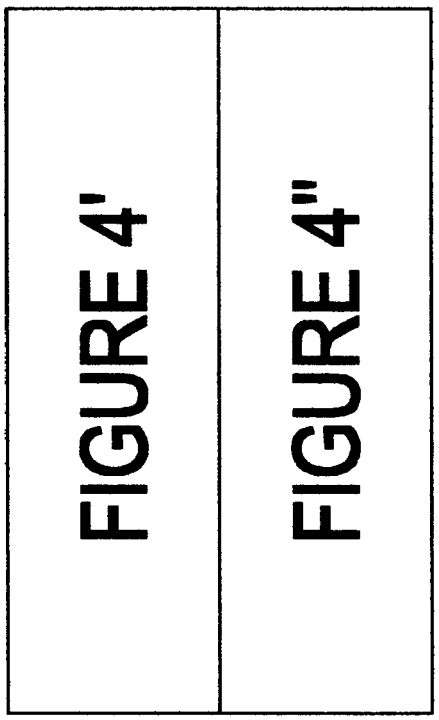
FIG. 4 is a schematic of arbitration comparators and a receiver circuit of the present invention.
Figure 4:
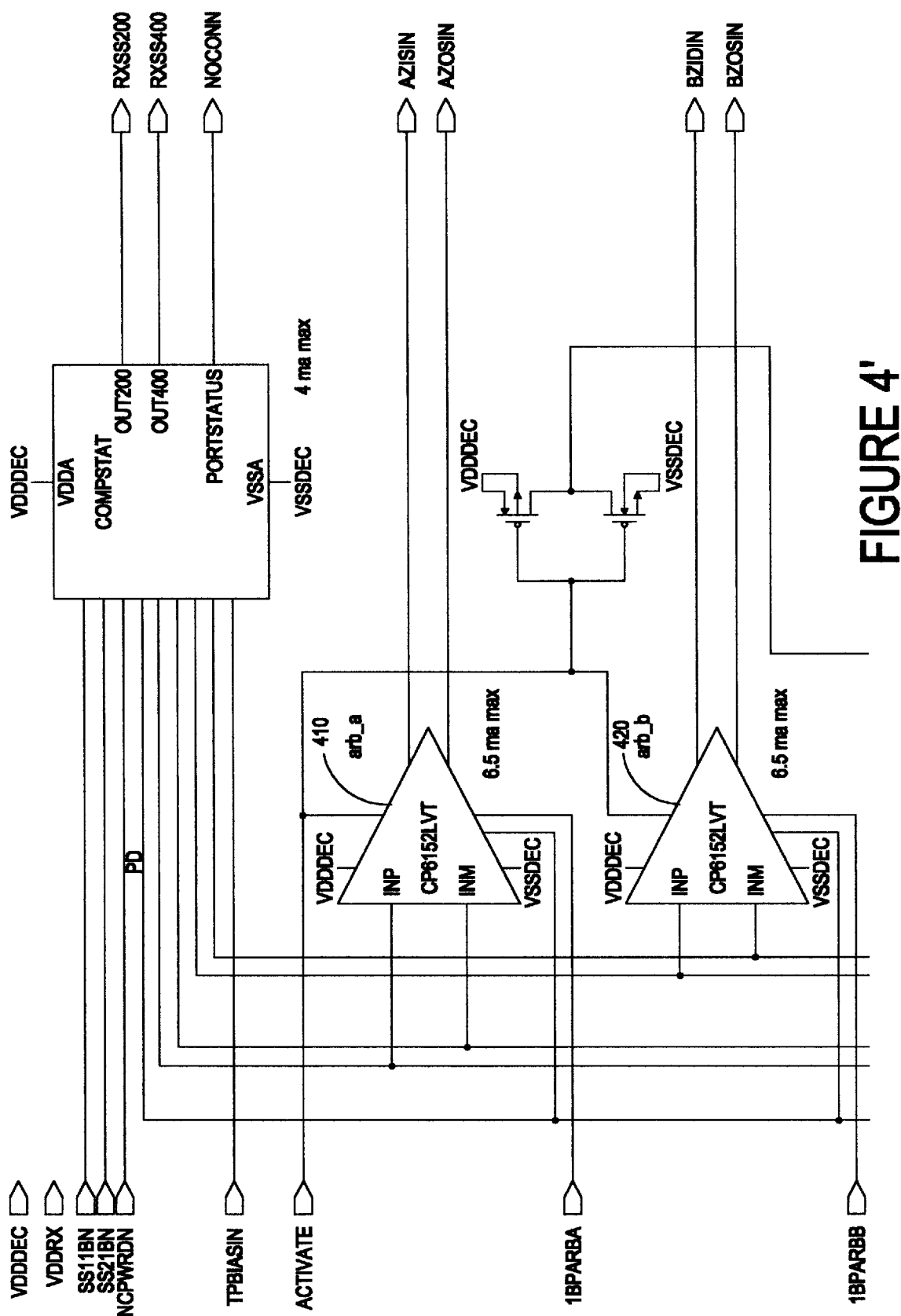

FIG. 4 is schematic of a receiver and arbitration device 400 of the present invention. Receiver and arbitration device 400 is included in each of ports 300 of FIG. 3. Receiver device 400 includes arbitration comparators 410, 420 and a data receiver block 430. Previous implementations used two comparators for each twisted pair. However, this added unnecessary capacitive loading to the twisted pair. To reduce capacitive loading on the twisted pair, the present invention uses a single, two-output comparator for each twisted pair. In this manner, the capacitive load on each twisted pair due to the arbitration comparators is halved. An additional benefit is reduced power dissipation.

Figure 5:
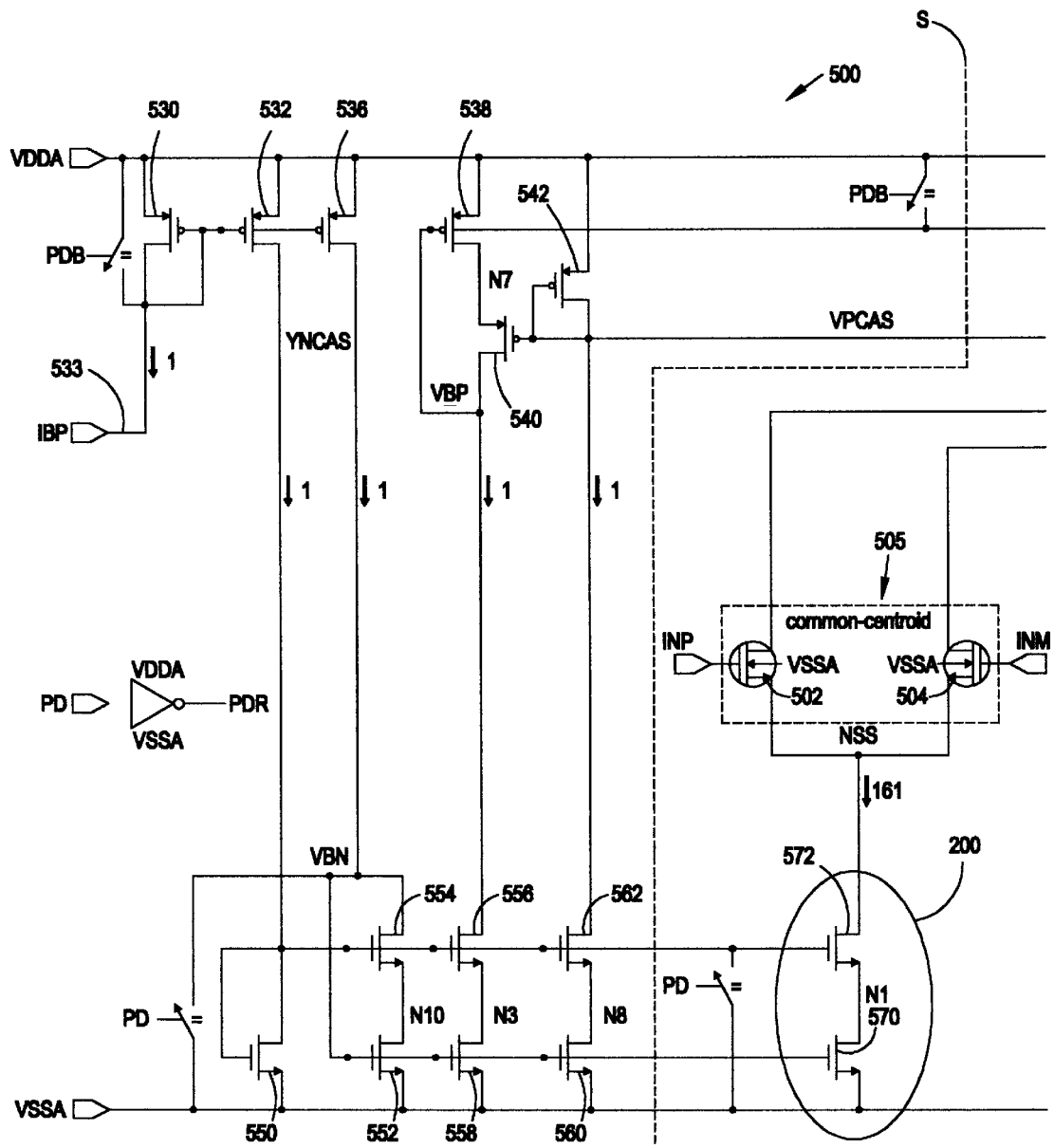
FIG. 5 is a schematic of one of the arbitration comparators of FIG. 4.

FIG. 5 illustrates the schematic for both arbitration comparators 410, 420 of FIG. 4. Arbitration comparators 410, 420 are used when the port first has to win the bus through an arbitration sequence. Three level signaling is used during the sequence because two ports may be transmitting simultaneously. The actual arbitration signaling on the twisted pairs is about plus or minus 4 milliamps current signal that is transmitted into external load resistors (not shown) ±220 mV voltage swing. Arbitration comparators 410, 420 essentially provide a window comparison function that has high and low trip points. See Table 1.

It is desirable to have the trip points accurately meet the 1394 specification (Table 1). However, to detect a differential signal, like the arbitration signaling, a DC offset voltage must be added into the signal path to make arbitration comparators 410, 420 trip other than at a non-zero level. If the offset is put directly in the signal path, the input signal may degrade. Also, the directly added offset can be poorly controlled with respect to processing and temperature variations, thus introducing a variation in the offset that will affect the trip points.

Before the differential signal can be converted to a full rail-to-rail digital swing by a buffer, it is desirable to amplify the signal to a higher level, usually somewhere between 0.5 to one volt signal swing. The preamplifier of the present invention amplifies the differential signal. Preferably that preamplifier has a bandwidth which is higher than the differential signal energy present in that signal to prevent degradation of the signal transitions. If the signal transitions are skewed due to inadequate preamplifier bandwidth, jitter is introduced in the signal.

Basically, each arbitration comparator 410, 420 includes one preamplifier and two separate output buffers driven by a common preamplifier to provide dual outputs. The two output buffers have their switch points skewed to achieve the desired overall trip points. See Table 1 below for the value of those trip points.

TABLE 1

| $T_pA/T_pB$ differential voltage ($V_d$) | Port State |
| --- | --- |
| $V_d > 168$ mV | 1 |
| $-89$ mV $< V_d < 89$ mV | Z |
| $V_d < -168$ mV | 0 |

Each comparator 410, 420 includes a wide-swing bias circuit 500 (shown to the left of line S in FIG. 5), an input stage 505, a current bias circuit 515, a load circuit 525, dual-output buffers 545, 555 and an offset voltage circuit 510. Wide-swing bias circuit 500, input stage 505, current bias circuit 515, load circuit 525, and offset voltage circuit 510 comprise well-controlled preamplifier circuit 575 (all circuitry to the left of line T in FIG. 5).

Input stage 505 includes low-threshold transistors 502, 504 that receive differential inputs on respective leads 501 and 503. The differential input signals can be provided from either $T_pA$ or $T_pB$. The common mode voltage range for leads 501, 503 is about 1.03–2.515 volts. Low-threshold transistors 502, 504 turn on at several hundred millivolts, and from an operational perspective, almost immediately. Low-threshold transistors 502, 504 are preferred because of the lower end of the common mode voltage range. Briefly, about 0.4 mA flows through both transistors 502, 504. Thus, the total current through transistors 570, 572 is about 0.8 ma. A voltage greater than 0.4 to 0.6 volts is required to keep devices 570, 572 in saturation. With 0.4–0.6 volts at node 501, and a voltage drop across each transistor 502, 504 of about 0.3–0.4 volts, the voltage at the gates of transistors 502, 504 is non-zero, and approaches 1 volt.

The drains of transistors 502, 504 are respectively coupled to nodes 590, 592. Also coupled to nodes 590, 592 is current bias circuit 515. Current bias circuit 515 provides the operational current that allows the amplification of signals that are input on leads 501, 503 to be provided at nodes 520, 522. Essentially, current provided by current bias circuit 515 is split (proportionately) between transistors 502, 504 and load transistors 511, 512 of load circuit 525. The proportionality is determined by the input signals. Transistors 511, 512 are preferably low-threshold transistors configured as diodes.

The gain for the preamplifier 575 is approximately 2.5–3.0. The gain is determined by the small signal transconductance ($g_m$) from gate to channel of transistors 502, 504 ($g_{m502,504}$) divided by the transconductance of transistors 511, 512 ($g_{m510,512}$). The transconductances for each set of transistors is determined by the device sizes and the current bias provided by current bias circuit 515. The device lengths of transistors 502, 504, 511, 512 are the same, while the device widths of transistors 502, 504 are greater than those for transistors 511, 512. The currents through transistors 502, 504, 511 and 512 accurately track between themselves during process and temperature variations.

To illustrate the basic operation of preamplifier 575, an input on lead 501 is about 1.9 volts and an input on lead 503 is about 1.8 volts. Generally, the input voltages will be approximately 110 mV less than the low common mode range or will be approximately 110 mV greater than the high common mode range (for data). Transistor 502 is turned on more (or harder) than transistor 504, thus causing more current to flow through transistor 502 than transistor 504. This causes less current into transistor 511 than transistor 512. The voltage at node 520 will be less than the voltage at node 522. Accordingly, the voltage differential between nodes 520, 522 is determined by the voltage differential between signals on leads 501, 503 multiplied by $g_{m502,504}$ divided by $g_{m510,512}$.

The well-controlled aspect of amplifier 575 is achieved since all the transistors are made from the same semiconductor manufacturing process and have their physical dimensions precisely matched. Furthermore, a well controlled current IBP (preferably 50 $\mu$A) is sinked through a lead 533. Because all the transistors' dimensions are precisely matched, any current variation in current IBP is propagated throughout the comparator, i.e., all the currents in the comparator are proportional to current IBP.

Bias circuit 500 is comprised of multiple current mirrors including conventional single-device and cascoded mirrors. A first mirror includes transistors 530, 532. A second mirror includes transistors 530, 536. These mirrors are the single-device mirrors. A third mirror includes transistors 552, 554, 556 and 558. A fourth mirror includes transistors 552, 554, 560 and 562. A fifth current mirror includes transistors 554, 570 and 572. Bias circuit 500 controls the current through transistors 570, 572, 514 and 516 to be fixed or constant.

Some of the current sources have a folded cascode configuration. Such a folded cascode includes transistors 502, 504 with 580, 582. This configuration provides for an operationally wide common mode voltage range for preamplifier 575.

Cascode transistor 572 is used to reduce noise and increase the common mode rejection of input stage 505. Moreover, by more accurately controlling the current through transistors 570, 572, the precise trip points of arbitration comparators 410, 420 can be controlled using the currents through transistors 510, 512.

Voltage offset circuit 510 provides voltage offsets at nodes 520, 522. The reason these offset voltages are provided is, as shown in Table 1, the output buffers 545, 555 provide outputs that transition at a nominal 125 mV or –125 mV. As will be explained in more detail, using offset voltage circuit 510 helps achieve those transition points. In particular, offset voltage circuit 510 generates a positive offset of about 135 mV at either of nodes 520, 522. Voltage offset circuit 510 provides a positive level shifting of the voltages at nodes 520, 522.

Cascoded transistors 580, 582 between nodes 520, 522, 590 and 592 maintain the voltage at nodes 590, 592 at a relatively constant level regardless of the input voltages on leads 501, 503. In this manner, a high output impedance is provided "looking" through transistors 580, 582 from nodes 520, 522 to nodes 590, 592. Thus, the gain of preamplifier 575 is mainly determined by the loads 511, 512. Also, diode connected load transistors 510, 512 aid in preamplifier 575 having a wide bandwidth. Preamplifier 575 has gains in the range of about two or three, which is a fairly low gain. Cascode transistors 580, 582 also act as low impedance loads to input transistor pair 502, 504 to produce a voltage gain of close to one to nodes 590, 592. This low gain reduces the effective input capacitance seen at nodes 501, 503 to a much lower level than would be obtained without a cascode stage.

The following transistor and resistor values are preferred for arbitration comparators 410, 420. Transistors 530, 532, 536, 538, 592, 514, 516, 552, 558, 560 and 570 have a channel length of 2.0 $\mu$m. Transistors 540, 554, 556, 562, 572, 580, 582 and 594 have channel lengths of 0.6 $\mu$m. Transistors 502, 504, 511 and 512 have channel lengths of 1.5 $\mu$m. Transistors 542 and 550 have channel lengths of 5.0 $\mu$m. Resistors 580, 585 have resistive values of 500 ohms.

Transistors 530, 532, 536, 552, 558 and 560 have channel widths of 40.0 $\mu$m. Transistors 540, 554, 556 and 562 have channel widths of 20 $\mu$m. Transistor 538 has a channel width of 25.0 $\mu$m. Transistor 542 has a channel width of 15.0 $\mu$m. Transistor 550 has a channel width of 14.0 $\mu$m. Transistor 570 has a channel width of 640.0 $\mu$m. Transistor 572 has a channel width of 320.0 $\mu$m. Transistors 502, 504 have channel width of 75.0 $\mu$m. Transistors 511, 512 have channel widths of 12.5 $\mu$m. Transistors 514, 516 have channel widths of 350.0 $\mu$m. Transistors 580, 582 have channel widths of 120.0 $\mu$m. Transistor 592 has a channel width of 225.0 $\mu$m. Transistor 594 has a channel width of 220.0 $\mu$m.

Figure 6:
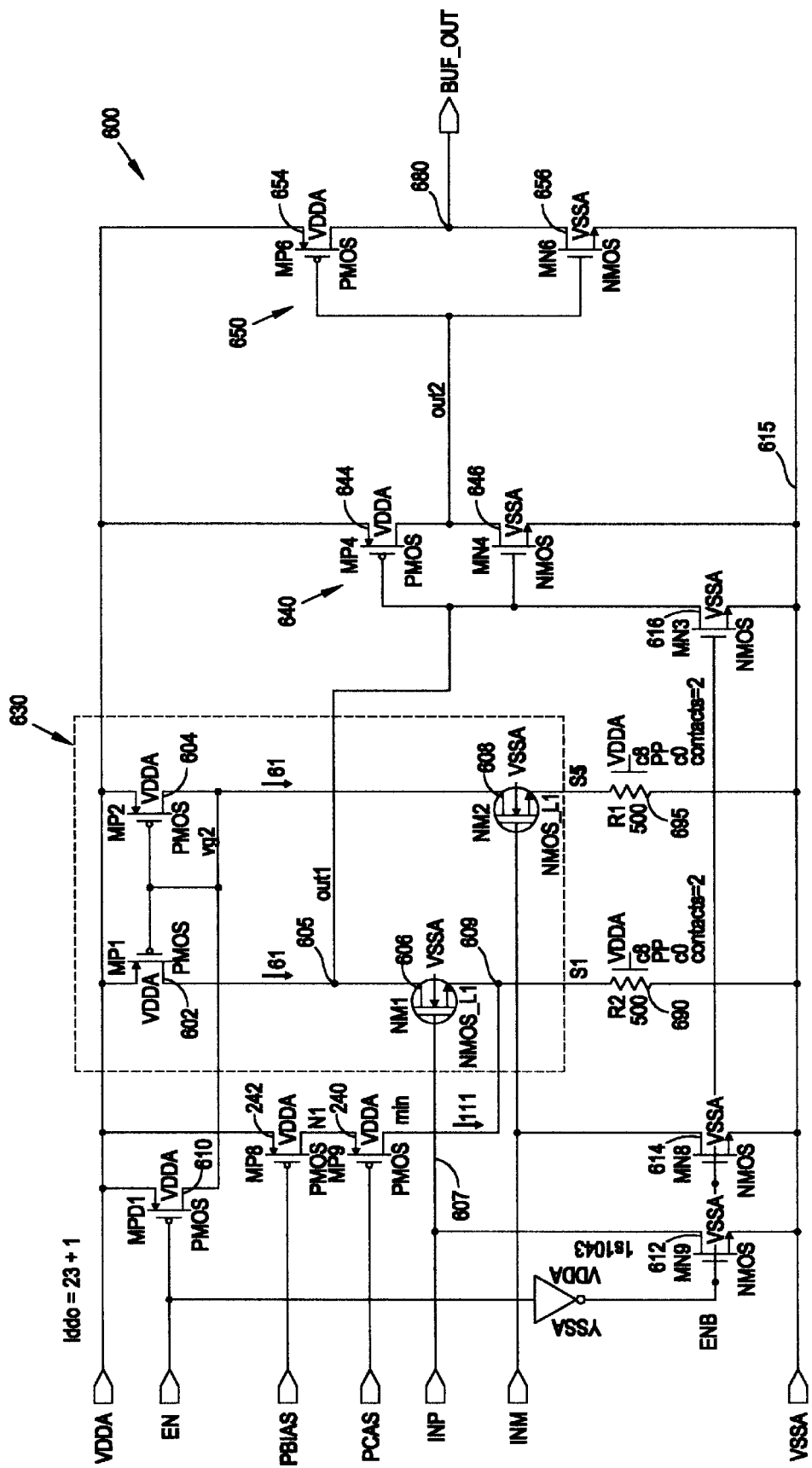
FIG. 6 is a schematic of one of the output buffers of FIG. 5.

FIG. 6 illustrates an output buffer 600 that is connected to preamplifier 575 of FIG. 5. Such a buffer is used for both buffers 545, 555, except the inputs INP and INM are reversed between them. Buffer 600 includes a differential-to-single-ended converter 630 that includes transistors 602, 604, 606, 608. Preferably, transistors 606, 608 are low-threshold transistors. An output on node 605 is provided that is referenced to a voltage VSSA provided on lead 615. Transistors 610, 612, 614 and 616 are used to disable the buffer 600, and the converter 630 when they are not needed to save power.

The output at node 605 may not swing rail-to-rail. Furthermore, node 605 does not have the required capacitive drive capabilities. To provide appropriate drive capabilities at output node 680, additional buffers 640, 650 are coupled to 605. Although only one additional buffer can be used, this buffer would require large device sizes. Such sizes would increase load capacitance at node 605, thereby decreasing transition speed at node 605. Preferably, then, and as shown in FIG. 6, additional buffers 640, 650 are provided. Buffer 650 has device widths that are greater than those of buffer 640, and has device lengths that are less than those of buffer 640. As such, acceptable drive capabilities are provided at output node 680 without providing an increased capacitive load at node 605.

Output buffer 600 works well with preamplifier 575 because they both use NMOS devices that are ground referenced. Thus, currents in buffer 600 directly track the currents in amplifier 575 due to the device size ratios between buffer 600 and amplifier 575. In other words, process variations "track out" between buffer 600 and preamplifier 575 so that current is mirrored in buffer 600 from amplifier 575.

One benefit of the arbitration comparators 410, 420 is that errors in preamplifier 575 are equally applied to the two output buffers. In other words, if two independent preamplifiers were used for each buffer, all the error terms would be independent of each other. In the arbitration comparators 410, 420 of the present invention, independent errors are only in the output buffers.

Explanation of the trip point setting of amplifier 575 and buffer 600 will explained with reference to FIGS. 5 and 6. Turning to FIG. 6, a trip point voltage Vtrip is generated at node 609 by current through resistor 690 to set the trip points as set out in Table 1. Resistor 690 acts as a level shifter. No trip point voltage is generated by resistor 695 since that voltage would have to be less than the ground reference voltage.

Although providing Vtrip at node 609 sets the trip points, the input signal on lead 607 must be level shifted to Vtrip/2. With Vtrip generated by resistor 690, zero voltage offset generated by resistor 695 and Vtrip/2 generated by either of resistors 580, 585 (FIG. 5), the effect is that converter 630 functions as if level shifted with a plus and minus voltage offset. Moreover, transistor 510, resistor 580, transistor 606 and resistor 690 form a current mirror with transistors 510 and 606 having the same device size for accurate current tracking. Likewise, transistor 512, resistor 585, transistor 608 and resistor 695 form a current mirror with transistors 512 and 608 having the same device size for accurate current tracking. These current mirrors are reversed (between the figures) for the other buffer 600 configuration. Note also that transistors 540, 542 are controlled by bias circuit 500 (FIG. 5) to also more accurately track current between buffer 600 and amplifier 575.

It is important to note that when a current source is generated from a resistor and voltage source, the function of the current source will be subject to the process variation of the resistor. This variation is compounded since accurate values of resistors are difficult to precisely manufacture. Accordingly, the present invention utilizes ratios between the devices of amplifier 575 and buffer 600. To that end, comparators 410, 420 are biased with a current source IBP. This provides for stable voltages and currents throughout the comparators 410, 420. Furthermore, current source IBP is generated from a reference voltage drop across a resistive material that is the same as the material used for resistors 580, 585, 690, 695.

The following transistor and resistor values are preferred for buffer 600. Transistors 610, 240, 612, 614, 616, 654 and 656 have channel lengths of 0.6 μm. Transistors 242, 602 and 604 have channel lengths of 2.0 μm. Transistors 606, 608 have channel lengths of 1.5 μm. Transistors 644 and 646 have channel lengths of 1.0 μm. Resistors 690, 695 have resistive values of 500 ohms.

Transistors 610, 612 and 614 have channel widths of 4.0 μm. Transistors 602, 604 have channel widths of 40.0 μm. Transistors 606, 608 have channel widths of 12.5 μm. Transistors 644, 654 have channel widths of 20.0 μm. Transistor 616 has a channel width of 2.0 μm. Transistor 646 has a channel width of 7.0 μm. Transistor 656 has a channel width of 10.0 μm.

Figure 7:
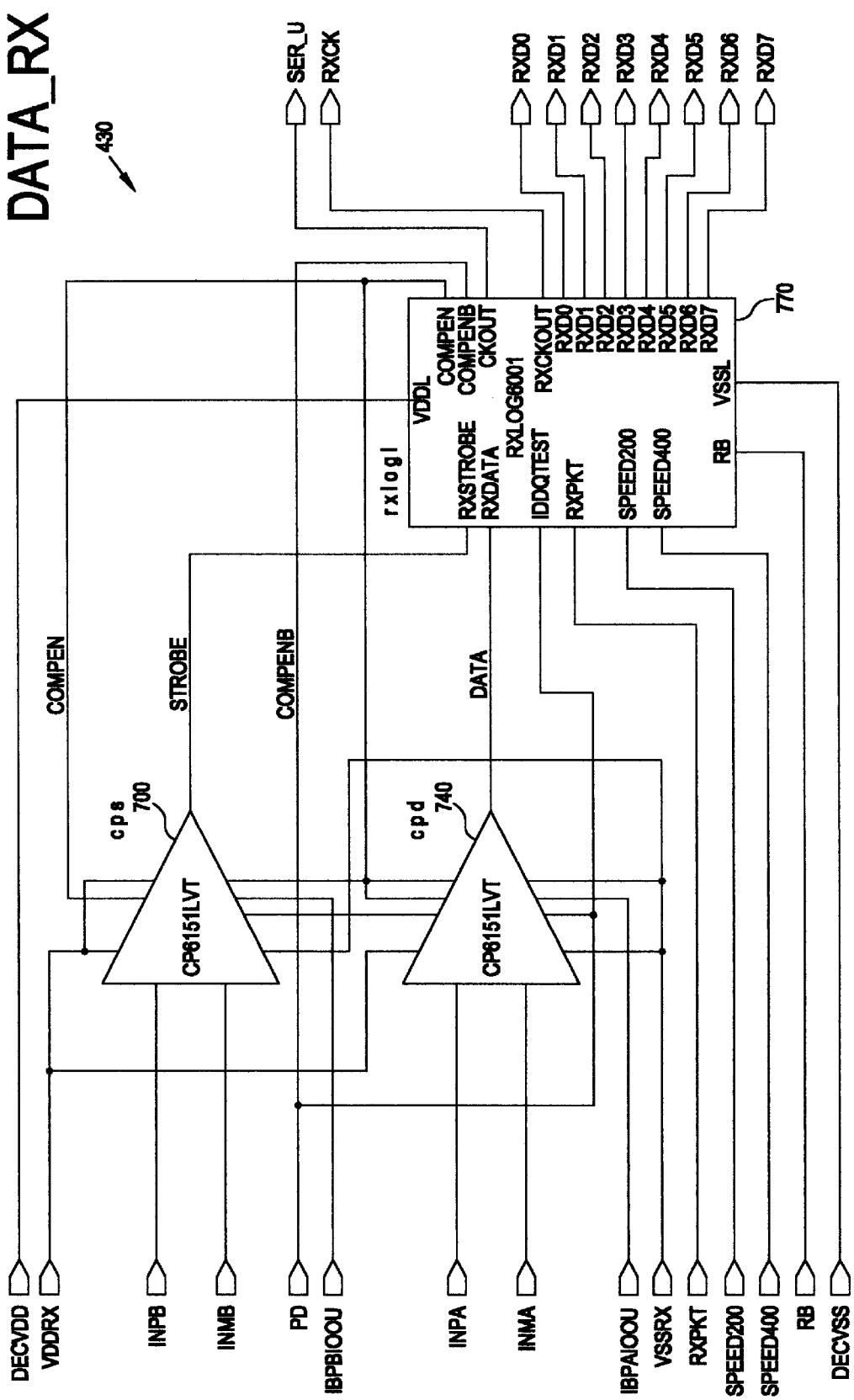
FIG. 7 is a block diagram of the data receiver block of FIG. 4.

FIG. 7 illustrates the schematic for the data receiver block 430 of FIG. 4. Data receiver block 430 includes a strobe comparator 700, a data comparator 740 and a data logic 770.

Figure 8:
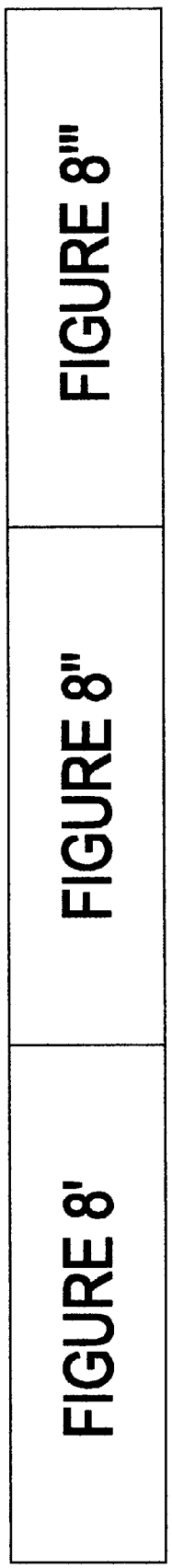
FIG. 8 is a schematic of one of the comparators of FIG. 7.
Figure 8:
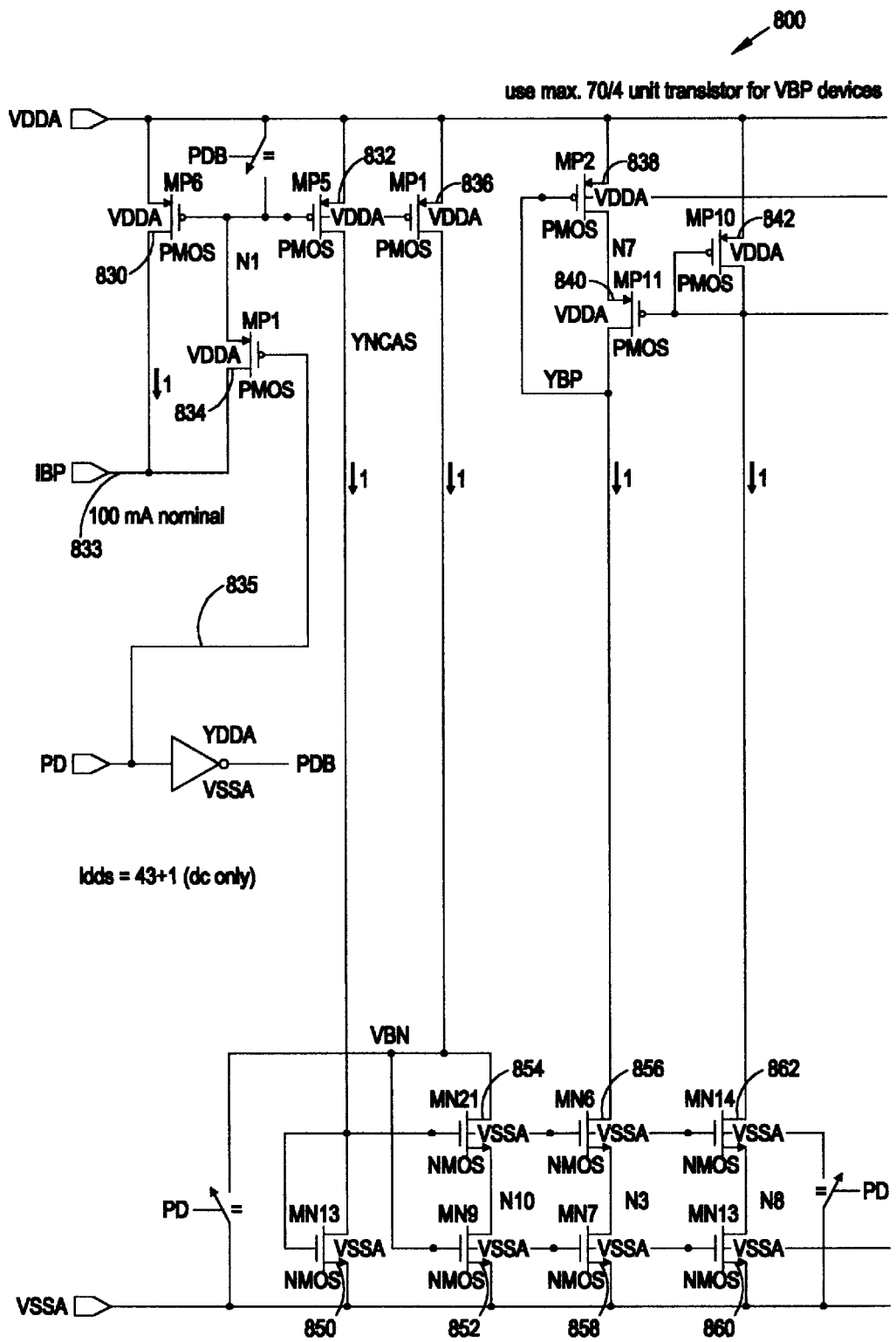
Figure 8:
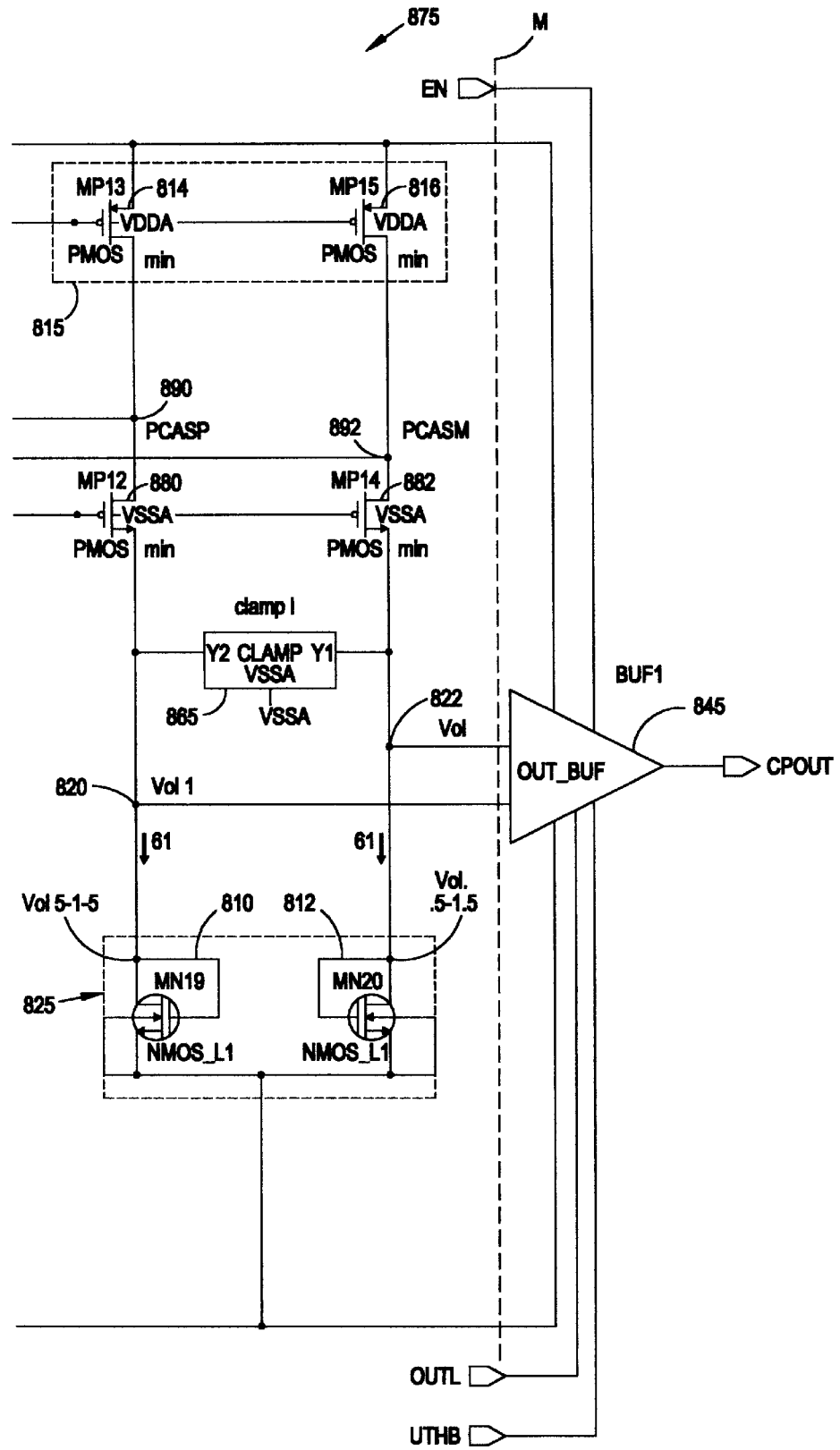

FIG. 8 illustrates the schematic for both comparators 700, 740 of FIG. 7. Each comparator 700, 740 includes a wide-swing bias circuit 800, an input stage 805, a current bias circuit 815, a load circuit 825, an output buffer 845 and a clamp circuit 865. Wide-swing bias circuit 800, input stage 805, current bias circuit 815, load circuit 825, and a clamp circuit 865 comprise a well-controlled preamplifier circuit 875 (all circuitry to the left of line M in FIG. 8).

Input stage 805 includes low-threshold transistors 802, 804 that receive differential inputs on respective leads 801 and 803. Transistors 802, 804 form a single stage input. The common mode voltage range for leads 801, 803 is 1.165–2.515 volts. Low-threshold transistors 802, 804 turn on at several hundred millivolts, and from an operational perspective, almost immediately. Low-threshold transistors 802, 804 are preferred because of the lower end of the common mode voltage range. Briefly, about 1.6 mA flows through both transistors 802, 804 (about 0.8 mA each). Thus, the total current through transistor 870 is about 1.6 ma. This current source transistor can supply its specified current for drain voltages as low as 0.8–0.4 volts. Assuming 0.4 volts at the node associated with lead 801, and a gate-to-source voltage of 0.3–0.4 volts for each transistor 802, 804 biased at 0.8 mA drain current, the voltage at the gates of transistors 802, 804 is non-zero, and approaches 1 volt.

Alternatively, parallel NMOS and PMOS input stages that sum their currents can be used, to achieve the required common-mode range. Also, the transition between the NMOS and PMOS input stages cannot be well controlled. As a consequence, different propagation delays occur over the common mode voltage range. This parallel input stage approach also results in a much higher input capacitance then a low threshold NMOS input stage.

The drains of transistors 802, 804 are respectively coupled to nodes 890, 892. Also coupled to nodes 890, 892 is current bias circuit 815. Current bias circuit 815 provides the operational current that allows the amplification of signals input on leads 801, 803 to be provided at nodes 820, 822. Essentially, current provided by current bias circuit 815 is split (proportionately) between transistors 802, 804 and load transistors 810, 812 of load circuit 825. Transistors 810, 812 are preferably low-threshold transistors configured as diodes.

The gain for the preamplifier 875 is approximately 5–6. The gain is determined by the small signal transconductance ($g_m$) from gate to channel of transistors 802, 804 ($g_{m802,804}$) divided by the transconductance of transistors 810, 812 ($g_{m810,812}$). The transconductances for each set of transistors is determined by the device sizes and the current bias provided by current bias circuit 815.

To illustrate the basic operation of preamplifier 875, an input on lead 801 is about 1.9 volts and an input on lead 803 is about 1.8 volts. Generally, the input voltages can be approximately 110 mV less than the low common mode range or can be approximately 110 mV greater than the high common mode range (for data). The input voltages are centered around the common mode voltage. Transistor 802 is turned on more or harder than transistor 804, thus causing more current to flow through transistor 802 than transistor 804. This causes less current into transistor 810 than transistor 812. The voltage at node 820 will be less than the voltage at node 822. Accordingly, the voltage differential between nodes 820, 822 is determined by the voltage differential between signals on leads 801, 803 multiplied by $g_{m802,804}$ divided by $g_{m810,812}$.

The well-controlled aspect of amplifier 875 is achieved since all the transistors are made from the same semiconductor manufacturing process and have their physical dimensions precisely matched. Furthermore, a well controlled current IBP (preferably 100 μA) is sinked through a lead 833. Because all the transistors' dimensions are precisely matched, any current variation in current IBP is propagated throughout the comparator, i.e., all the currents in the comparator are proportional to current IBP.

Furthermore, the DC bias currents in load transistors 810, 812 should be chosen such that those bias currents never go to zero, even for the maximum allowed input differential signal level. This assures constant comparator propagation delays versus the input differential level.

Bias circuit 800 is comprised of multiple current mirrors including conventional single-device and cascoded mirrors. A first mirror includes transistors 830, 832. A second mirror includes transistors 830, 836. These mirrors are the single-device mirrors. A third mirror includes transistors 852, 854, 856 and 858. A fourth mirror includes transistors 852, 854, 860 ad 862. A fifth current mirror includes transistors 852 and 870. Transistor 834 is a power-down transistor controlled by a power-down signal received on a lead 835. Bias circuit 800 controls the current through transistors 870, 814 and 816 to be fixed or constant.

Cascoded transistors 880, 882 between nodes 820, 822, 890 and 892 maintain the voltage at nodes 890, 892 at a relatively constant level regardless of the input voltages on leads 801, 803. In this manner, a high output impedance is provided "looking" through transistors 880, 882 from nodes 820, 822 to nodes 890, 892. Thus, the gain of preamplifier 875 is mainly determined by the loads 810, 812.

Clamp circuit 865 limits the voltage swing at nodes 820, 822 for high differential input levels. This in turn maintains output transition speeds at nodes 820, 822. Otherwise, if clamp circuit 865 was not provided, the voltage swings at nodes 820, 822 would swing greatly. As a result, transition times would increase because of the great voltage swings. Clamp circuit 865 functions as a nonlinear resistor.

The following transistor values are preferred for preamplifier 875. Transistors 830, 832, 836, 834, 852,, 858, 860, 870, 814 and 816 have channel lengths of 2.0 μm. Transistors 840, 854, 856, 862, 880 and 882 have channel lengths of 0.6 μm. Transistors 802, 804, 810 and 812 have channel lengths of 0.8 μm. Transistor 842 has a channel length of 4.0 μm. Transistor 850 has a channel length of 5.0 μm.

Transistors 830, 832, 836, 852, 858 and 860 have channel widths of 40.0 μm. Transistors 840, 842, 854, 856 and 862 have channel widths of 20.0 μm. Transistor 838 has a channel width of 35.0 μm. Transistor 834 has a channel width of 10.0 μm. Transistor 850 has a channel width of 14.0 μm. Transistor 870 has a channel width of 640.0 μm. Transistors 802 and 804 have channel widths of 150.0 μm. Transistors 814, 816 have channel widths of 490.0 μm. Transistors 880, 882 have channel widths of 120.0 μm. Transistors 810, 812 have channel widths of 12.0 μm.

Figure 9:
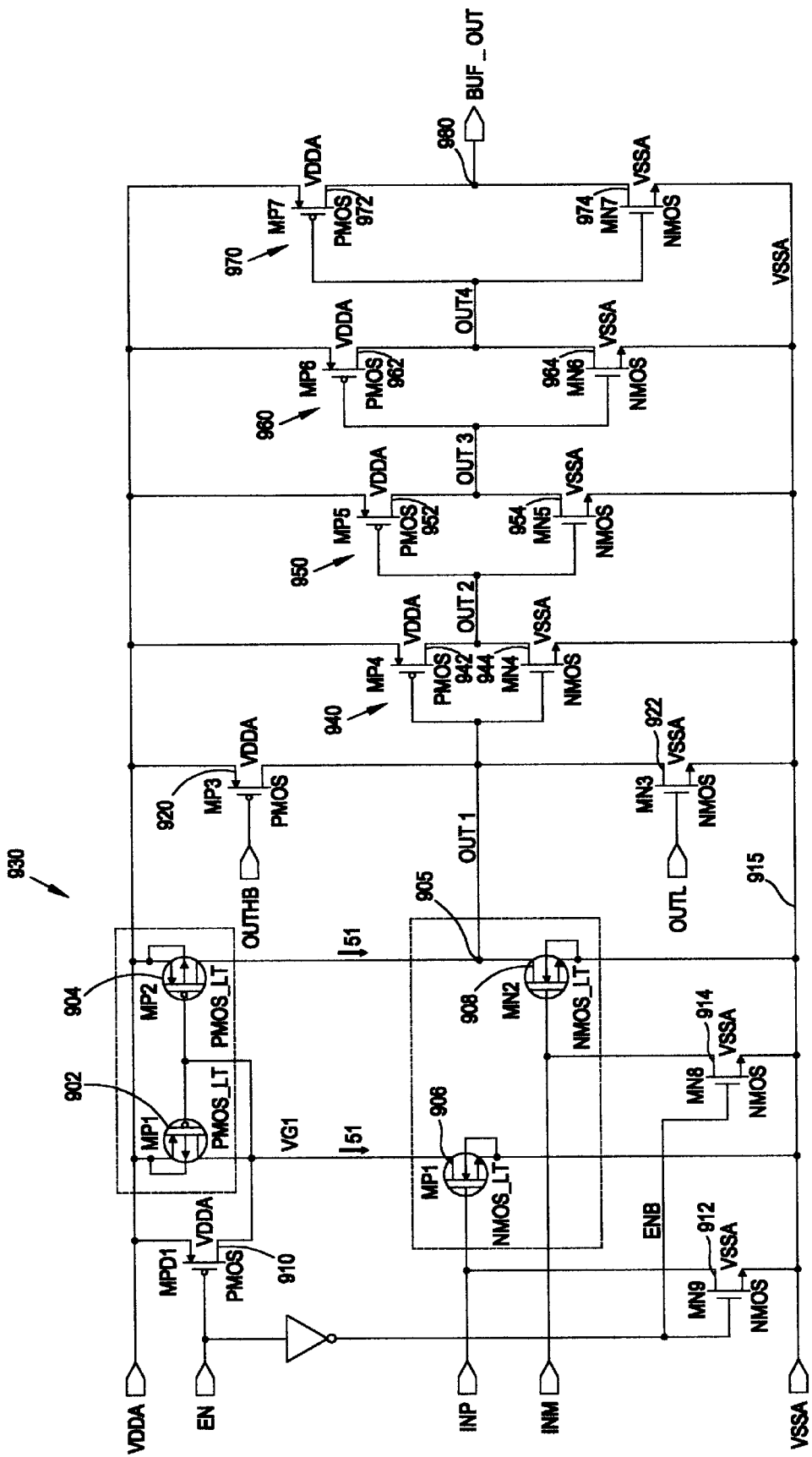
FIG. 9 is a schematic of the output buffer of FIG. 8.

FIG. 9 illustrates an output buffer 900 that is connected to preamplifier 875 of FIG. 8. Such a buffer is used for both data and strobe reception. Buffer 900 includes a differential-to-single-ended converter 930 that includes transistors 902, 904, 906, 908. Preferably, transistors 906, 908 are low-threshold transistors. Transistors 902, 904 can be low-threshold transistors, but that depends on the manufacturing process technology. An output on node 905 is provided that is referenced to a voltage VSSA provided on lead 915. Transistors 910, 912 and 914 are used to disable the buffer, particularly the converter 930, when clocked data is not being received.

Transistors 920, 922 are either both off or one transistor is on while the other transistor is off. When the data or strobe comparator 700, 740 (FIG. 7) are not receiving signals, their respective outputs have to be in at certain state. Specifically, data comparator 700 must output a one or high when data is not received. Conversely, strobe comparator 740 must output a zero or low when no strobe signal is received. As shown in FIG. 9, when transistor 920 is on or active, node 905 is pulled to VDDA or high. When transistor 922 is on or active, node 905 is pulled to VSSA or low. Thereafter, the voltage at node 905 is propagated by additional buffers 940, 950, 960, 970.

The output at node 905 may not swing rail-to-rail. To provide rail-to-rail voltage swings and to provide appropriate drive capabilities at output node 980, additional buffers 940, 950, 960, 970 are coupled to 905. Although an additional buffer can be used, this buffer would require large device sizes. Such sizes would increase load capacitance at node 905, thereby decreasing transition speed at node 905. Preferably, then, and as shown in FIG. 9, additional buffers 940, 950, 960, 970 are provided. Each successive buffer has device widths that are greater than the previous stage, but less than the following stage. In this manner, acceptable drive capabilities are provided at output node 980 without providing an increased capacitive load at node 905.

An important difference between comparators 410, 420 and 710, 740 is that comparators 710, 740 must operate at higher input rates than comparators 410, 420. Thus, device sizes of transistors in comparators 710, 740 and the associated bias current levels are optimized for those higher input rates. As a result, the same device sizes and bias currents may be inappropriate or wasteful in comparators 410, 420.

The following transistor values are preferred for buffer 900. Transistors 910, 912, 914, 920, 922, 942, 944, 952, 954, 962, 964, 972 and 974 have channel lengths of 0.6 μm. Transistors 902, 904 have channel lengths of 1.0 μm. Transistors 906, 908 have channel lengths of 0.8 μm. Transistors 910, 920 have channel widths of 4.0 μm. Transistors 902, 904 have channel widths of 21.0 μm. Transistors 906, 908 have channel widths of 10.0 μm. Transistor 922 has a channel width of 2.0 μm. Transistors 912, 914 have channel widths of 8.0 μm. Transistors 942, 952, 962 and 972 have respective channel widths of 20.0 μm, 24.0 μm, 30.0 μm and 36.0 μm. Transistors 944, 954, 964 and 974 have respective channel widths of 7.0 μm, 8.4 μm, 11:0 μm and 15.0 μm.

Figure 10:
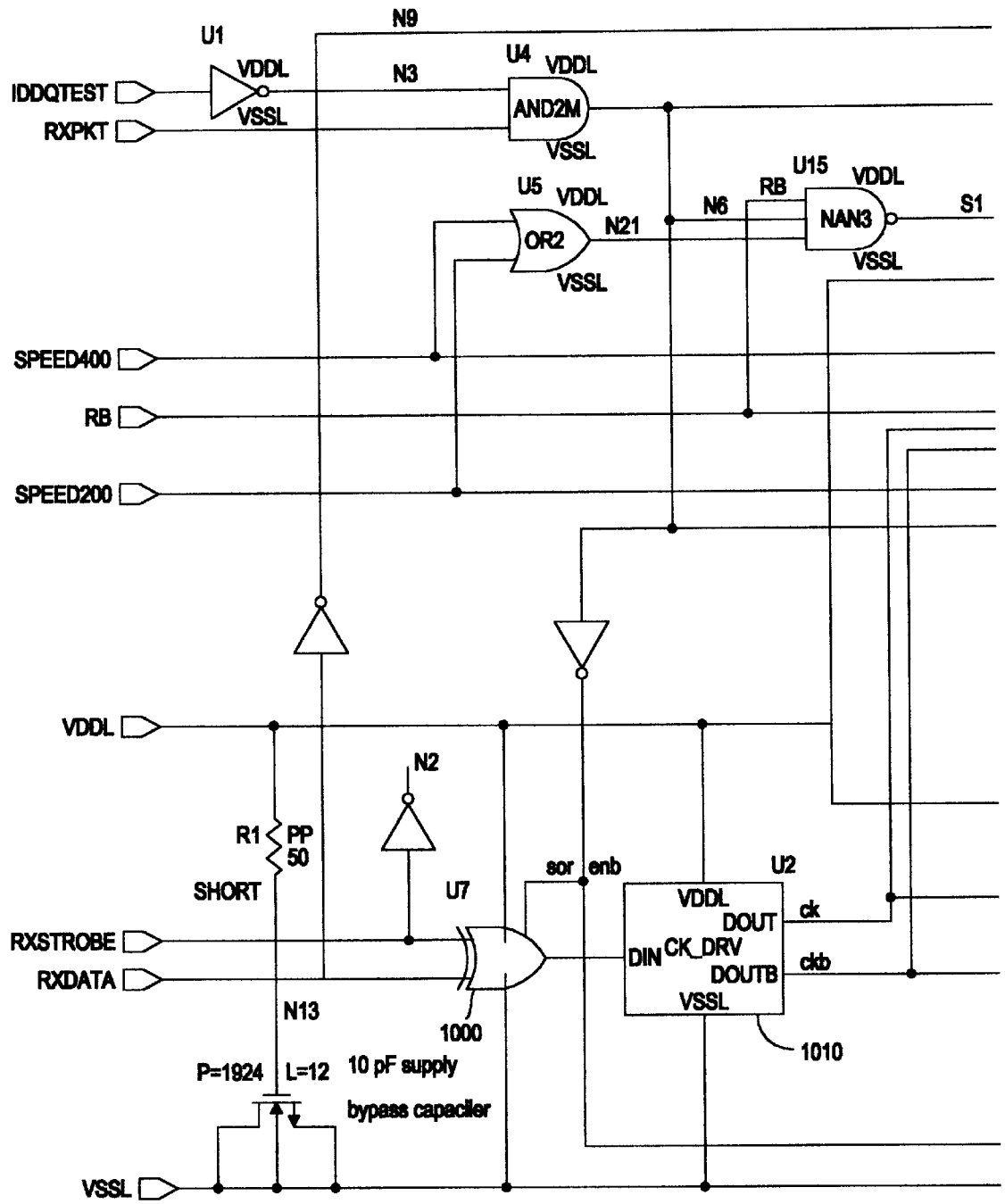
FIG. 10 is a schematic of the data logic of FIG. 7.
Figure 11:
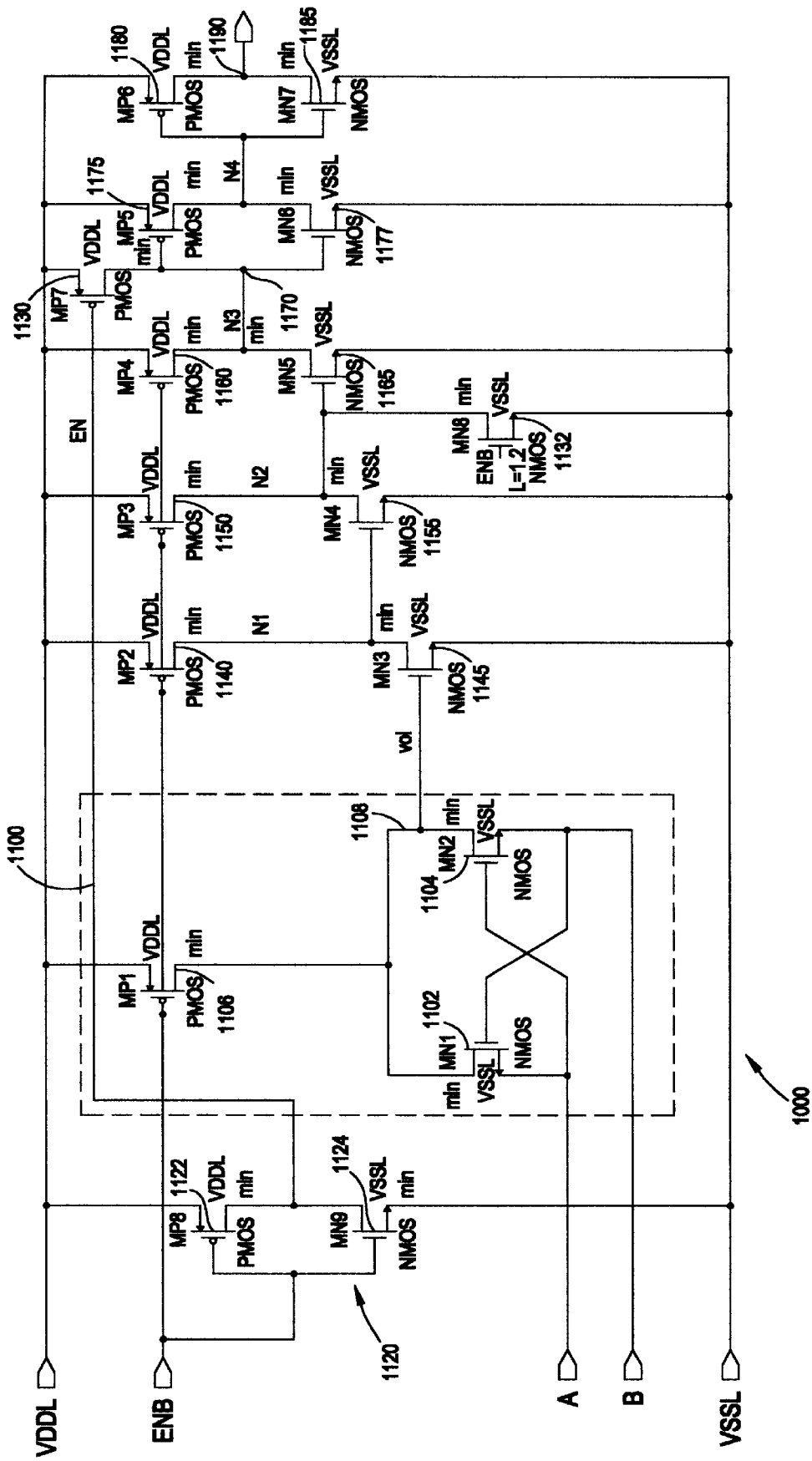
FIG. 11 is a schematic of the exclusive-OR device of FIG. 10.

FIG. 10 illustrates the components of data logic 770 of FIG. 7. Data logic 770 includes an XOR circuit 1000, a clock driver 1010, state machines 1020, 1030 and a deserializer block 1040. FIG. 11 discloses a schematic for XOR circuit 1000. Transistors 1102, 1104 and 1106 comprise an XOR function logic 1100. One advantage of XOR circuit 1000 is that the complements of A and B are not required. If the complements were required, a skew between the signal and its complement would have to compensated for by, typically, adding delay in a signal path. However, that delay may be deleterious to maintaining a high speed XOR function, especially when trying to provide a very narrow pulse.

Inverter 1120 inverts an enable signal. The output of inverter 1120 controls transistor 1130. The enable signal controls load transistors 1132, 1140, 1150 and 1160. The enable disables all the load transistors to eliminate static power dissipation of XOR circuit 1000 and always force the output high when disabled.

The signal at node 1108 does not swing rail-to-rail and also has a relatively low drive level. To overcome that, cascade transistor stages 1145, 1155 and 1165 are used that have small increments in device sizes, preferably widths, between stages. This allows the fastest rise/fall times at node 1108. In addition, transistor pairs 1140, 1145; 1150, 1155; and 1160, 1165 are pseudo-NMOS inverters since the p-channel transistors 1140, 1150 and 1160 are used as loads and are not controlled by the voltage at node 1108. Using transistors 1140, 1150 and 1160 as loads provides for faster rise/fall times since the gates of transistors 1140, 1150 and 1160 are not driven.

The signal at node 1170 swings between from VSSL+ε to VDDL. Transistor 1175 has a width that is preferably three times the width of transistor 1177 so that transistor 1175 will turn on at a higher voltage. This in turn compensates for the voltage VSSL+ε at node 1170. Transistors 1180, 1185 form a conventional CMOS buffer that provides a rail-to-rail output at node 1190.

Operationally, a main issue for a data/strobe decoder is making it jitter tolerant at high data rates. This means that the data and strobe signal transitions can be skewed close together and the data can still be recovered. As a result, an exclusive-or function of the data and strobe to generate the clock must operate at high data rates. Such an exclusive-or function would generate narrow pulses with about a 0.5 nanosecond width. The XOR circuit 1000 of FIG. 11 meets this requirement.

The following transistor values are preferred for XOR circuit 1000. All of the transistors in FIG. 11 have a channel length of 0.6 μm. Transistors 1122, 1106 and 1150 have channel widths of 6.0 μm. Transistors 1130, 1132 have channel widths of 2.0 μm. Transistors 1102, 1104 have channel widths of 7.0 μm. Transistors 1140 and 1177 have channel widths of 4.0 μm. Transistor 1145 has a channel width of 3.0 μm. Transistor 1155 has a channel width of 5.0 μm. Transistors 1165, 1185 have a channel width of 7.5 μm. Transistor 1160 has a channel width of 9.0 μm. Transistor 1175 has a channel width of 12.0 μm. Transistor 1180 has a channel width of 10.0 μm.

Figure 16:
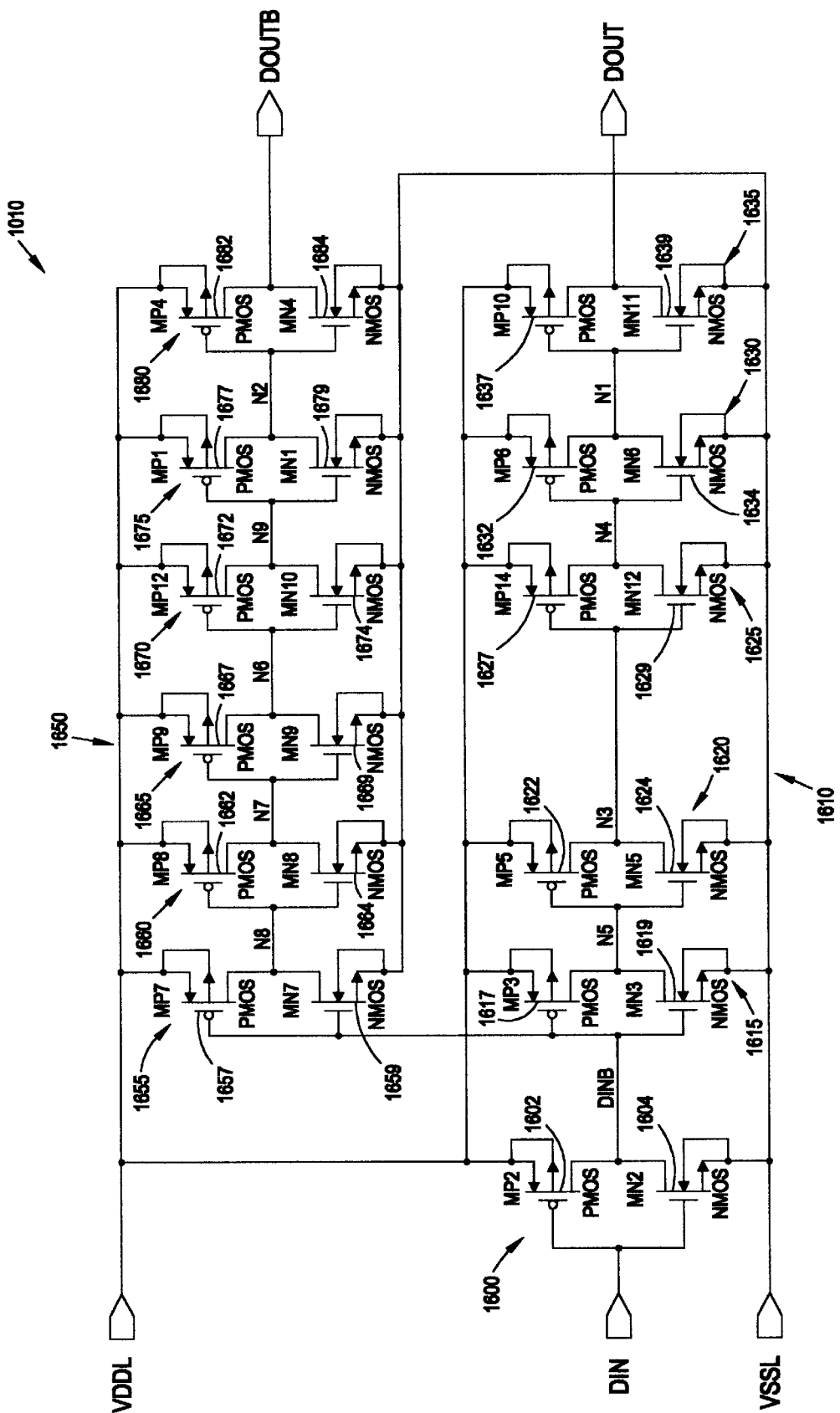
FIG. 16 is a schematic of the clock driver of FIG. 10.

FIG. 16 illustrates the clock driver 1010 of FIG. 10. Driver 1010 includes a inverter 1600 that receives the output pulse of XOR circuit 1000. The output of inverter 1600 (an inverted pulse) is coupled to parallel delay circuits 1610, 1650. Delay circuit 1610 includes five cascaded inverters 1615, 1620, 1625, 1630 and 1635. The output of inverter 1635 is a delayed version of the output pulse received by inverter 1600. Delay circuit 1650 includes six cascaded inverters 1655, 1660, 1665, 1670, 1675 and 1680. The output of inverter 1680 is a delayed inverted version of the output pulse received by inverter 1600. Since delay circuit 1610 has one less inverter than delay circuit 1650, and it is desirable to have minimal skew between the edges of the delayed version and the delayed inverted version of the output pulse, device sizes for some of the inverters in delay circuit 1610 are smaller than device sizes for some of the inverters in delay circuit 1650. For the present invention, a delay or skew between the edges of the delayed version and the delayed inverted version of the output pulse is less than 100 picoseconds.

The following transistor values are preferred for clock driver 1010. All the transistors of FIG. 16 have a channel length of 0.6 μm. Transistors 1604, 1629 have channel widths of 8.0 μm. Transistors 1602, 1627 have channel widths of 16.0 μm. Transistors 1639, 1672 and 1684 have channel widths of 18.0 μm. Transistors 1634, 1662, 1679 have channel widths of 12.0 μm. Transistors 1624, 1659 have channel widths of 5.0 μm. Transistors 1622, 1657 have channel widths of 10.0 μm. Transistors 1617, 1664 have channel widths of 6.0 μm. Transistor 1619 has a channel width of 3.0 μm. Transistor 1667 has a channel width of 14.0 μm. Transistor 1669 has a channel width of 7.0 μm. Transistor 1674 has a channel width of 9.0 μm. Transistors 1632, 1677 have channel widths of 24.0 μm. Transistors 1637, 1682 have channel widths of 36.0 μm.

Figure 12:
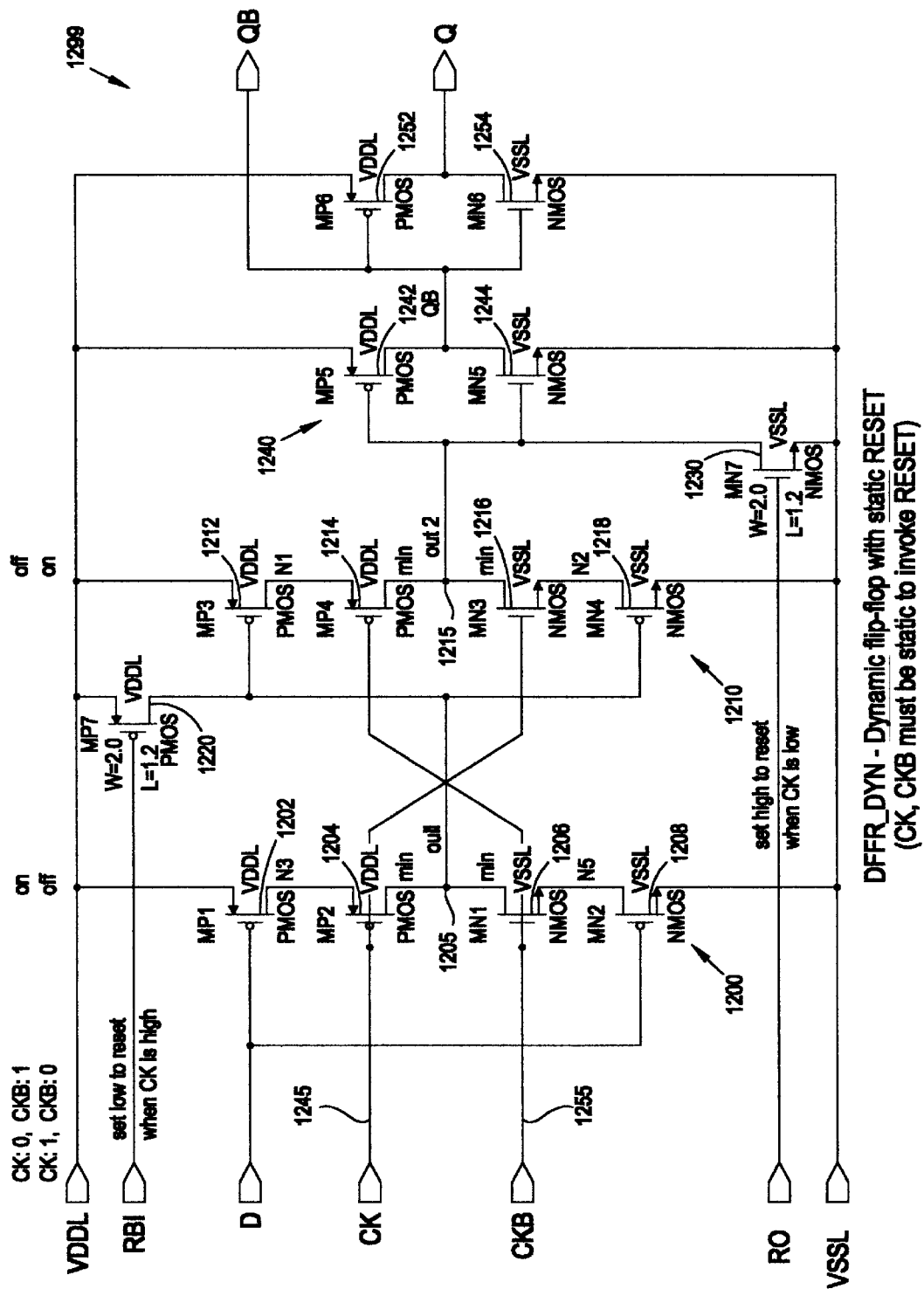
FIG. 12 is a schematic of a flip-flop of the present invention.

FIG. 12 illustrates a flip-flop 1299 according to the present invention. Flip-flop 1299 is able to correctly operate with the clock pulse widths as narrow as 0.5 nanoseconds as generated by the XOR circuit/1000. Flip-flop 1299 is dynamic, and includes clocked inverters 1200, 1210. When either inverter 1200, 1210 is not clocked, the output at respective nodes 1205, 1215 has a high-impedance value. The high-impedance value at node 1205 is passed to the gates of the clock transistors of inverter 1210, which may not be entirely off. If the gates of the input transistors of inverter 1210 are floating, then inverter 1210 can use static power. Since this static power is undesirable, a p-channel transistor 1220, when active, pulls the gates of the input transistors of clocked inverter high to eliminate static power. The same explanation is applicable to inverters 1210 and 1240. In that configuration, transistor 1230 is provided to turn off inverter 1240 to prevent static power dissipation.

One problem with dynamic logic is that when clocking has stopped to that logic, internal nodes float. The floating nodes cause unwanted static power dissipation. Referring to flip-flop 1299 in FIG. 12, when data is not being received on a port, flip-flop 1299 is reset to avoid static power dissipation. The use of transistors 1220, 1230—both having relatively small device sizes—function to reset the floating nodes of flip-flop 1299.

In operation, the two cascaded clocked inverters 1200, 1210 have memory at nodes 1205 and 1215 when clock signals on leads 1245, 1255 are not active. The memory is the charge on those nodes that causes a floating voltage of initially close to VDD or VSS. With time, depending on leakage currents, this voltage may drift either high or low. This memory is provided as an input to either clocked inverter 1210 (from node 1205) or inverter 1240 (from node 1215). Consequently, current flow (power dissipation) results through inverter 1210 or inverter 1240.

To eliminate this power dissipation, transistor 1220 pulls node 1205 to VDD to completely turn off inverter 1210. Similarly, transistor 1230 pulls node 1215 to VSS to completely turn off inverter 1240. Transistor 1220 is active when the clock signal on lead 1245 is high and transistor 1230 is active when the clock signal on lead 1245 is low.

The following transistor values are preferred for flip-flop 1299. All the transistors shown in FIG. 12 have channel lengths of 0.6 μm. Transistors 1202, 1204, 1212, 1214 and 1242 have channel widths of 10.0 μm. Transistors 1206, 1208, 1216, 1218 and 1244 have channel widths of 5.0 μm. Transistors 1220, 1230 have channel widths of 1.0 μm. Transistor 1252 has a channel width of 15.0 μm. Transistor 1254 has a channel width of 7.5 μm.

Turning to FIG. 10 again, two state machines 1020 and 1030 are shown that determine which data bit is being decoded. As one skilled in the art will recognize, data logic 770 functions to decode or generate a clock signal from the data and strobe signal, and to deserialize the incoming data stream. The data is serially received and is output by data logic 770 as 8-bit parallel data.

Figure 13:
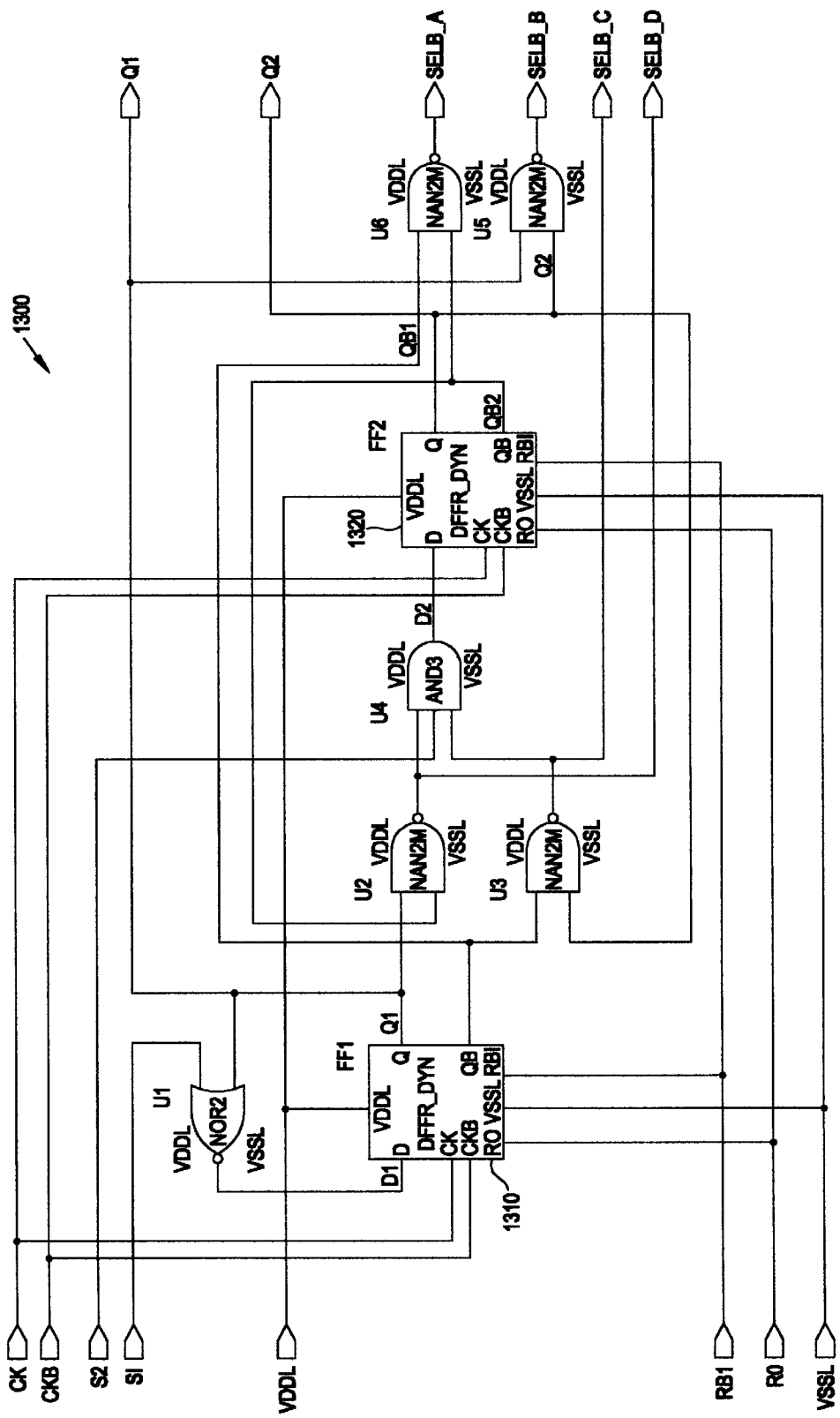
FIG. 13 is a schematic of either state machine of FIG. 10.

One problem that arises is that the state machines may have to function with a distorted clock signal. Since a single state machine would have a high failure rate, the present invention overcomes this problem by using two state machines. State machines 1020, 1030 operate on opposite clock phases generated by clock driver 1010 to provide better jitter tolerance. One state machine controls even bits and the other one controls odd bits as used in the present invention. The combination of state machines 1020, 1030 provides better tolerance to jitter between data and strobe signal. FIG. 13 illustrates a state machine 1300 that comprises either state machine 1020, 1030. State machine 1300 uses two flip-flops 1310, 1320 that are identical to flip-flop 1299 in FIG. 12.

Figure 14:
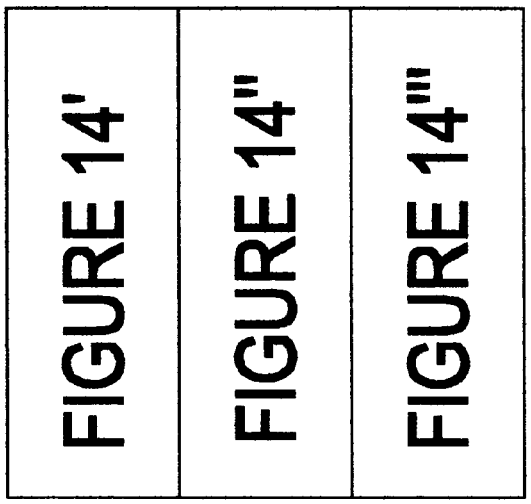
FIG. 14 is a schematic of the data deserializer block of FIG. 10.
Figure 14:
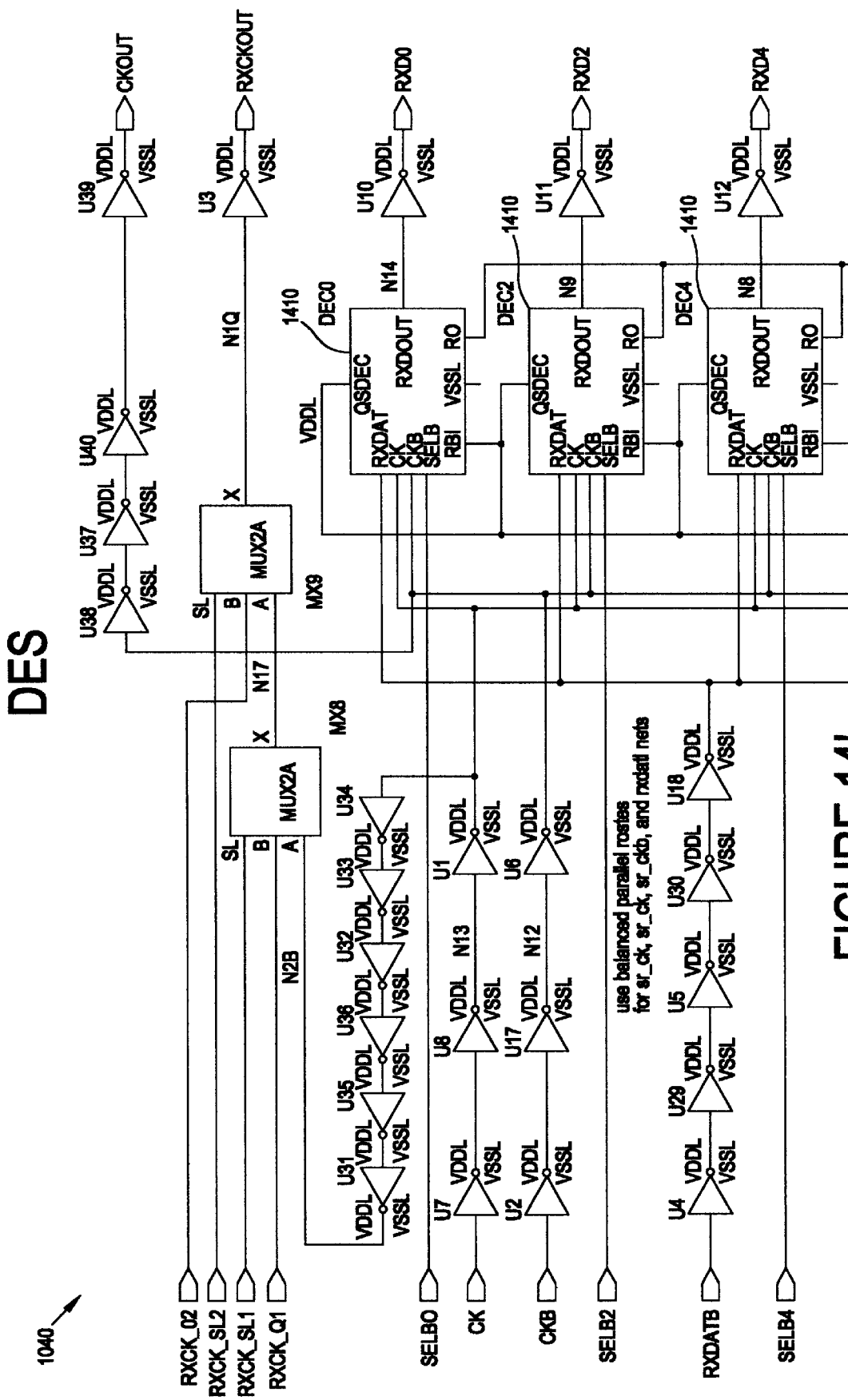
Figure 14:
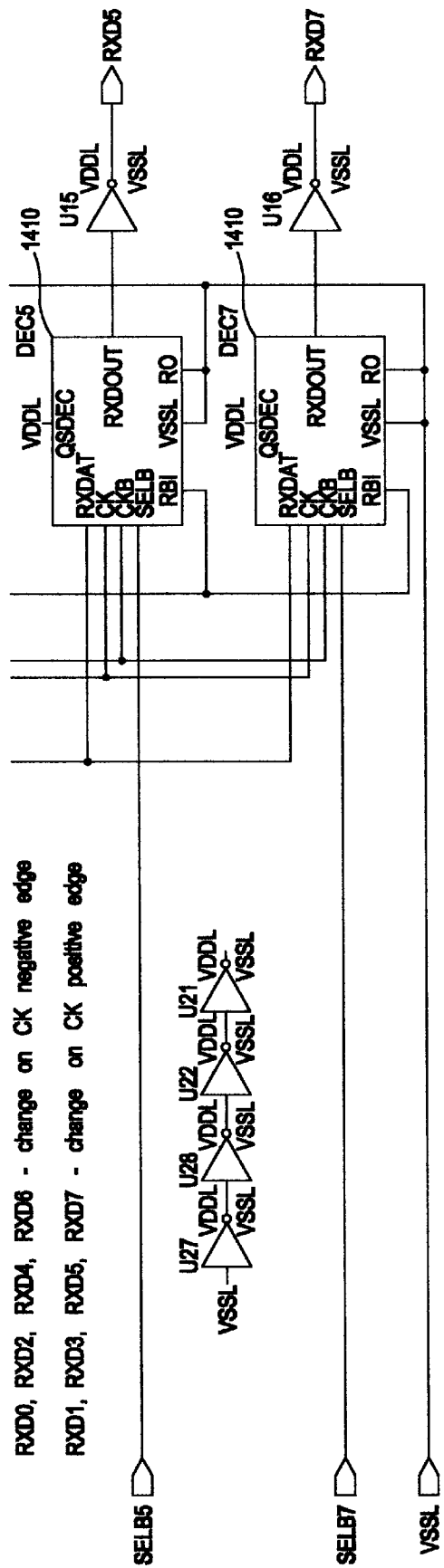
Figure 15:
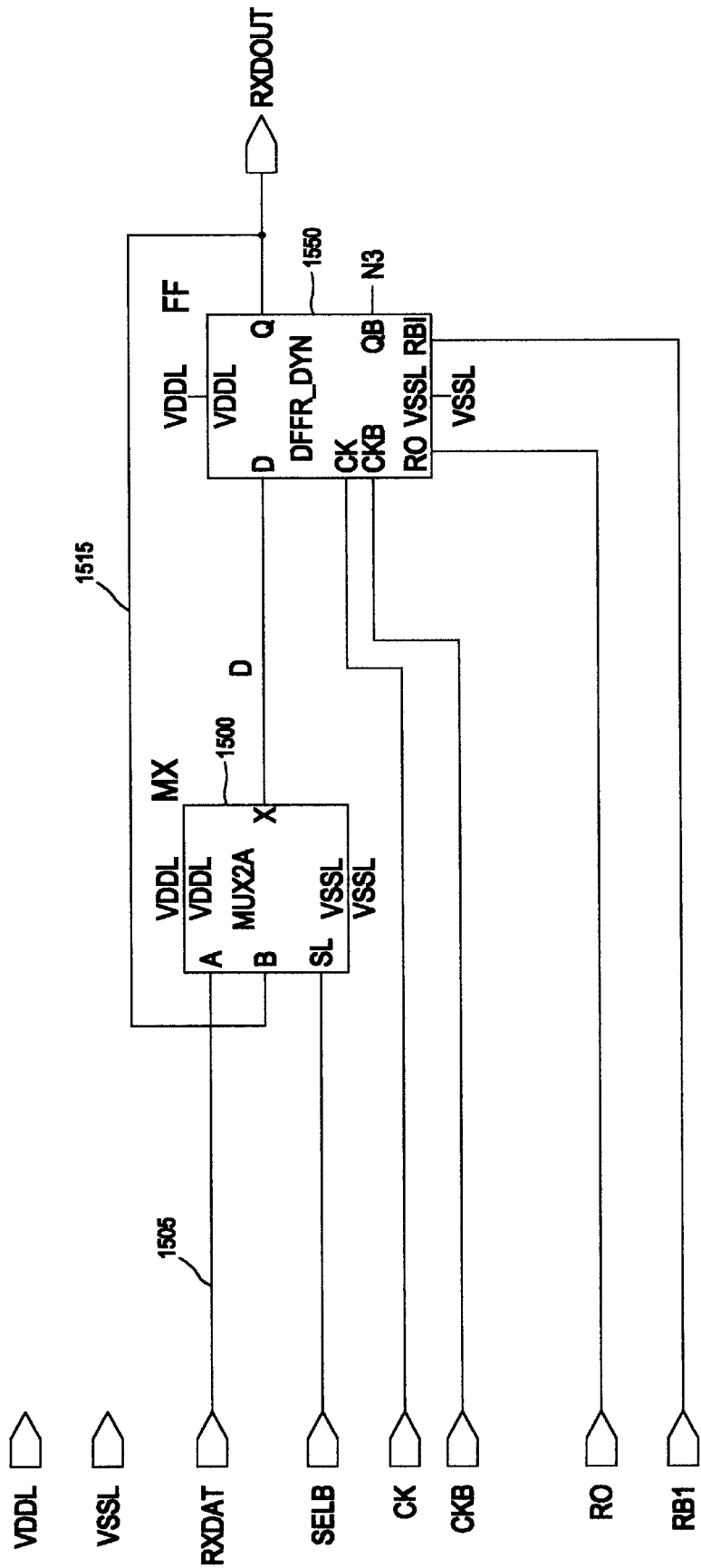
FIG. 15 is a schematic of one of the DS decoders of FIG. 14.

FIG. 14 shows a schematic for deserializer block 1040 of FIG. 10. Deserializer block 1040 preferably includes eight data deserializers 1410. Serial data input into deserializer block 1040 is output as parallel data by data deserializers 1410. FIG. 15 illustrates a schematic for each one of data deserializers 1410. As illustrated, a mulitplexor (MUX) 1500 is coupled to receive serial data via a lead 1505 at input A. MUX 1500 also receives, as feedback, the output of a flip-flop 1550 via a lead 1515. Flip-flop 1550 is identical to flip-flop 1299 of FIG. 12. An output of flip-flop 1550 is a parallel bit of the received serial data.

Numerous variations and modifications of the embodiment described above may be effected without departing from the spirit and scope of the novel features of the invention. It is to be understood that no limitations with respect to the specific device illustrated herein are intended or should be inferred. It is, of course, intended to cover by the appended claims all such modifications as fall within the scope of the claims.

APPENDIX 1

Electrical Specification for IEEE 1394–1995 Analog Cable Tranceiver
A single cable port consists of two differential twisted-pair line transceivers (TPA/TPA* and TPB/TPB*). When two ports are connected via an interface cable, TPA of port 1 connects to TPB of port 2 and vice versa. Twisted pair A transmits the Strobe signal and receives Data while twisted pair B transmits Data and receives Strobe (see FIG. 4–12 of the P1394 specification).
Each twisted-pair transceiver consists of a +/− 4 ma differential current driver, a data receiver (comparator), and two arbitration comparators. TPA also utilizes 2 additional comparators for receiving the common-mode speed signal. Twisted-pair A also transmits TpBias, which sets the common-mode DC bias of the line via two external 55 ohm termination resistors. TPB transmits the common-mode speed signal current (0, −3.5 ma, or −10 ma), and receives TpBias. TpBias is sensed by the Port_Status comparator to determine that a cable connection exists.
The transceiver will support data rates of 98.304 Mbit/sec (S100), 196.608 MBit/sec (S200), and 393.216 MBit/sec (S400).

|  | Min | Typ | Max | Units | Conditions |
|---|---|---|---|---|---|
| Device Specification Parameter |  |  |  |  |  |
| Supply voltage | 3.0 | 3.3 | 3.6 | V |  |
| Supply cuponht |  |  | 98 | mA |  |
| Supply current |  |  | 184 | mA | 3 ports |
| TpBias output voltage | 1.665 |  | 2.015 | V |  |

APPENDIX 1-continued

Electrical Specification for IEEE 1394–1995 Analog Cable Tranceiver
A single cable port consists of two differential twisted-pair line transceivers (TPA/TPA* and TPB/TPB*). When two ports are connected via an interface cable, TPA of port 1 connects to TPB of port 2 and vice versa. Twisted pair A transmits the Strobe signal and receives Data while twisted pair B transmits Data and receives Strobe (see FIG. 4–12 of the P1394 specification).
Each twisted-pair transceiver consists of a +/− 4 ma differential current driver, a data receiver (comparator), and two arbitration comparators. TPA also utilizes 2 additional comparators for receiving the common-mode speed signal. Twisted-pair A also transmits TpBias, which sets the common-mode DC bias of the line via two external 55 ohm termination resistors. TPB transmits the common-mode speed signal current (0, −3.5 ma, or −10 ma), and receives TpBias. TpBias is sensed by the Port_Status comparator to determine that a cable connection exists.
The transceiver will support data rates of 98.304 Mbit/sec (S100), 196.608 MBit/sec (S200), and 393.216 MBit/sec (S400).

|  | Min | Typ | Max | Units | Conditions |
|---|---|---|---|---|---|
| Power status input threshold voltage | TBD |  | 7.5 | V |  |
| Crystal oscillator frequency |  | 24.576 |  | MHz |  |
| Crystal oscillator frequency tolerance | −100 |  | 100 | ppm |  |
| Transmit jitter | −150 |  | 150 | ps | data and strobe |
| Transmit skew | −100 |  | 100 | ps | data relative to strobe |
| Receiver input jitter | −315 |  | 315 | ps | data and strobe |
| Receiver input skew | −500 |  | 500 | ps | data relative to strobe |
| Driver Specification Parameter |  |  |  |  |  |
| Differential output voltage | 172 |  | 265 | mV | 55 ohm load |
| Output common-mode voltage | 0.523 |  | 2.515 | V |  |
| Common-mode output current | −0.81 |  |  |  |  |
| Common-mode output current | −4.84 |  | −2.53 | mA | S200 |
| Common-mode output current | −12.40 |  | −8.10 | mA | S400 |
| TPA/TPB differential output resistance | 105 |  | 111 | ohms | transmit mode |
| TPA/TPB differential output resistance | 109 |  | 111 | ohms | receive mode |
| TPA/TPB differential output capacitance |  |  | 4 | pF |  |
| Output rise or fall time |  |  | 1.2 | ns | 10% to 90% |
| Receiver Specification Parameter |  |  |  |  |  |
| Differential input amplitude | 118 |  | 260 | mV | during data reception |
| Differential input amplitude | 168 |  | 265 | mV | during arbitration |
| Input common-mode voltage range | 1.165 |  | 2.515 | V | data comparators |
| Input common-mode voltage range | 1.03 |  | 2.515 | V | arbitration comparators |
| Receiver input threshold voltage | −25 |  | 25 | mV |  |
| Positive arbitration comparator threshold voltage | 89 |  | 168 | mV |  |

APPENDIX 1-continued

Electrical Specification for IEEE 1394–1995 Analog Cable Tranceiver
A single cable port consists of two differential twisted-pair line transceivers (TPA/TPA* and TPB/TPB*). When two ports are connected via an interface cable, TPA of port 1 connects to TPB of port 2 and vice versa. Twisted pair A transmits the Strobe signal and receives Data while twisted pair B transmits Data and receives Strobe (see FIG. 4–12 of the P1394 specification).
Each twisted-pair transceiver consists of a +/− 4 ma differential current driver, a data receiver (comparator), and two arbitration comparators. TPA also utilizes 2 additional comparators for receiving the common-mode speed signal. Twisted-pair A also transmits TpBias, which sets the common-mode DC bias of the line via two external 55 ohm termination resistors. TPB transmits the common-mode speed signal current (0, −3.5 ma, or −10 ma), and receives TpBias. TpBias is sensed by the Port_Status comparator to determine that a cable connection exists.
The transceiver will support data rates of 98.304 Mbit/sec (S100), 196.608 MBit/sec (S200), and 393.216 MBit/sec (S400).

|  | Min | Typ | Max | Units | Conditions |
| --- | --- | --- | --- | --- | --- |
| Negative arbitration comparator threshold voltage | −168 |  | −89 | mV |  |
| S200 speed signaling threshold voltage |  | 0.95*TpBias |  | V | TPA common-mode voltage |
| S400 speed signaling threshold voltage |  | 0.806*TpBias |  | V | TPA common-mode voltage |
| Port connection detect threshold voltage | 0.6 |  | 1.0 | V | TPB common-mode voltage |

I claim:

1. A dual output comparator for amplifying a differential signal and applying an offset thereto, said dual output comparator comprising:

a single preamplifier configured for receiving and amplifying the differential signal to provide an amplified differential signal; and two buffers connected to and driven by the single preamplifier, said two buffers configured to receive the amplified differential signal from the single preamplifier and apply the offset thereto, said two buffers having switch points which are skewed relative to each other to achieve pre-determined trip points, wherein the preamplifier includes a bias circuit which includes current sources having a folded cascade configuration.

2. A dual output comparator for amplifying a differential signal and applying an offset thereto, said dual output comparator comprising:

a single preamplifier configured for receiving and amplifying the differential signal to provide an amplified differential signal; and two buffers connected to and driven by the single preamplifier, said two buffers configured to receive the amplified differential signal from the single preamplifier and apply the offset thereto, said two buffers having switch points which are skewed relative to each other to achieve pre-determined trip points, wherein the preamplifier includes a plurality of low threshold transistors which are configured to turn on at several hundred millivolts.

3. A dual output comparator for amplifying a differential signal and applying an offset thereto, said dual output comparator comprising:

a single preamplifier configured for receiving and amplifying the differential signal to provide an amplified differential signal; and two buffers connected to and driven by the single preamplifier, said two buffers configured to receive the amplified differential signal from the single preamplifier and apply the offset thereto, said two buffers having switch points which are skewed relative to each other to achieve pre-determined trip points, wherein the preamplifier includes a clamp circuit which is configured to limit voltage swing at a plurality of nodes, said clamp circuit thereby configured to function as a non-linear resistor.

4. A dual output comparator for amplifying a differential signal and applying an offset thereto, said dual output comparator comprising:

a single preamplifier configured for receiving and amplifying the differential signal to provide an amplified differential signal; and two buffers connected to and driven by the single preamplifier, said two buffers configured to receive the amplified differential signal from the single preamplifier and apply the offset thereto, said two buffers having switch points which are skewed relative to each other to achieve pre-determined trip points, wherein each of said two buffers includes a differential-to-single-ended converter.

5. The comparator of claim 4 wherein each of said converters includes low-threshold transistors which are configured to turn on at several hundred millivolts.

6. The comparator of claim 4 wherein each of said two buffers includes a plurality of transistors which are configured to disable the respective converter when the two buffers are not needed.

7. A dual output comparator for amplifying a differential signal and applying an offset thereto, said dual output comparator comprising:

a single preamplifier configured for receiving and amplifying the differential signal to provide an amplified differential signal; and two buffers connected to and driven by the single preamplifier, said two buffers configured to receive the amplified differential signal from the single preamplifier and apply the offset thereto, said two buffers having switch points which are skewed relative to each other to achieve pre-determined trip points, wherein the preamplifier and the two buffers are configured to operate at input rates as high as about 400 Mbits/sec.

8. A method of amplifying a differential signal and applying an offset thereto, said method comprising:

using a single preamplifier to amplify the differential signal to provide an amplified differential signal;

using two buffers connected to and driven by the single preamplifier to apply the offset to the amplified differential signal, said two buffers having switch points which are skewed relative to each other to achieve pre-determined trip points; and providing a bias circuit in the preamplifier, wherein the bias circuit includes current sources having a folded cascade configuration.

9. A method of amplifying a differential signal and applying an offset thereto, said method comprising:

using a single preamplifier to amplify the differential signal to provide an amplified differential signal; and using two buffers connected to and driven by the single preamplifier to apply the offset to the amplified differential signal, said two buffers having switch points which are skewed relative to each other to achieve pre-determined trip points, wherein the preamplifier includes a plurality of low threshold transistors which are configured to turn on at several hundred millivolts.

10. A method of amplifying a differential signal and applying an offset thereto, said method comprising:

using a single preamplifier to amplify the differential signal to provide an amplified differential signal;

using two buffers connected to and driven by the single preamplifier to apply the offset to the amplified differential signal, said two buffers having switch points which are skewed relative to each other to achieve pre-determined trip points; and providing a clamp circuit in the preamplifier, wherein the clamp circuit is configured to limit voltage swing at a plurality of nodes, said clamp circuit thereby configured to function as a nonlinear resistor.

11. A method of amplifying a differential signal and applying an offset thereto, said method comprising:

using a single preamplifier to amplify the differential signal to provide an amplified differential signal;

using two buffers connected to and driven by the single preamplifier to apply the offset to the amplified differential signal, said two buffers having switch points which are skewed relative to each other to achieve pre-determined trip points; and providing a differential-to-single-ended converter in each of said two buffers.

12. The method of claim 11 wherein each of said converters includes low-threshold transistors which are configured to turn on at several hundred millivolts.

13. The method of claim 11 further comprising providing a plurality of transistors in each of said two buffers which are configured to disable each respective converter when the two buffers are not needed.

14. A method of amplifying a differential signal and applying an offset thereto, said method comprising:

using a single preamplifier to amplify the differential signal to provide an amplified differential signal; and using two buffers connected to and driven by the single preamplifier to apply the offset to the amplified differential signal, said two buffers having switch points which are skewed relative to each other to achieve pre-determined trip points, wherein the preamplifier and the two buffers are configured to operate at input rates as high as about 400 Mbits/sec.

* * * * *